United States Patent
Koh

(10) Patent No.: US 8,999,840 B2
(45) Date of Patent: Apr. 7, 2015

(54) METHOD OF FORMING FINE PATTERNS OF SEMICONDUCTOR DEVICE

(71) Applicant: Samsung Electronics Co., Ltd., Suwon-Si, Gyeonggi-Do (KR)

(72) Inventor: Cha-won Koh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 76 days.

(21) Appl. No.: 13/939,664

(22) Filed: Jul. 11, 2013

(65) Prior Publication Data

US 2015/0017808 A1   Jan. 15, 2015

(51) Int. Cl.
*H01L 21/027* (2006.01)
*H01L 21/308* (2006.01)
*H01L 21/02* (2006.01)
*H01L 21/311* (2006.01)
*G03F 7/09* (2006.01)

(52) U.S. Cl.
CPC ........ *H01L 21/0274* (2013.01); *H01L 21/3088* (2013.01); *H01L 21/0206* (2013.01); *H01L 21/02271* (2013.01); *H01L 21/0276* (2013.01); *H01L 21/31144* (2013.01); *G03F 7/091* (2013.01); *Y10S 438/948* (2013.01); *Y10S 438/949* (2013.01); *Y10S 438/952* (2013.01)

(58) Field of Classification Search
None
See application file for complete search history.

(56) References Cited

U.S. PATENT DOCUMENTS

| 7,115,532 | B2 * | 10/2006 | Daley | 438/780 |
| 2003/0198898 | A1 * | 10/2003 | Lin et al. | 430/315 |
| 2008/0063984 | A1 | 3/2008 | Zhang et al. | |
| 2014/0145311 | A1 * | 5/2014 | Olson et al. | 257/622 |
| 2014/0256146 | A1 * | 9/2014 | Chien et al. | 438/703 |

* cited by examiner

*Primary Examiner* — Charles Garber
*Assistant Examiner* — Alia Sabur
(74) *Attorney, Agent, or Firm* — Harness, Dickey & Pierce, P.L.C.

(57) ABSTRACT

A method of forming a micro pattern of a semiconductor device may include forming an acid-extinguisher containing film on a substrate, forming a photoresist film containing a potential acid on the acid-extinguisher containing film, forming an exposed area containing acids by exposing a portion of the photoresist film to light, forming an insoluble polymer thin film between the acid-extinguisher containing film and the exposed area by extinguishing the acids of the exposed area at an interface between the acid-extinguisher containing film and the exposed area, developing the photoresist film to form a space exposing the insoluble polymer thin film in the exposed area and a photoresist pattern integrally connected to the insoluble polymer thin film, exposing the acid-extinguisher containing film through the space by removing the insoluble polymer thin film, and removing the acid-extinguisher containing film exposed through the space.

20 Claims, 17 Drawing Sheets

METHOD OF FORMING FINE PATTERNS OF SEMICONDUCTOR DEVICE

BACKGROUND

1. Field

Example embodiments of the inventive concepts relate to a method of forming patterns of a semiconductor device, and more particularly, to a method of forming a micro pattern of a semiconductor device which is capable of preventing or inhibiting the collapse or tilting of the micro pattern.

2. Description of the Related Art

With the higher integration of semiconductor devices, the development of a technique for manufacturing a nano-scale semiconductor device is needed. For example, as a design rule of dynamic random access memory (DRAM) decreases, there is a need to form a plurality of line patterns that are arranged at micro pitches and with relatively high density. In particular, when a plurality of line patterns, which are arranged with relatively high density and have a micro width, are formed through a photolithography process using an extreme ultraviolet (EUV) light source with a wavelength of about 13 nm which is highly likely to be applied to a mass production process of a nano-scale semiconductor device having a size equal to or less than 40 nm, a technique is needed which is capable of improving productivity by preventing or inhibiting the collapse of a resist pattern even in a case where a thickness of the resist pattern that is used as an etching mask is increased in order to improve an etching margin.

SUMMARY

Example embodiments of the inventive concepts provide a method of forming a micro pattern of a semiconductor device that may prevent or inhibit the generation of a faulty pattern by preventing or inhibiting the collapse of a resist pattern during a photolithography process, and that may ensure a sufficient etching process margin by preventing or inhibiting the collapse of the resist pattern even when a thickness of the resist pattern used as an etching mask is increased in order to improve an etching margin during an etching process for forming the micro pattern.

According to example embodiments of the inventive concepts, a method of forming a micro pattern of a semiconductor device may include forming an acid-extinguisher containing film on a substrate, forming a photoresist film containing a potential acid on the acid-extinguisher containing film, forming an exposed area containing acids by exposing a portion of the photoresist film to light, forming an insoluble polymer thin film between the acid-extinguisher containing film and the exposed area by extinguishing the acids of the exposed area at an interface between the acid-extinguisher containing film and the exposed area, developing the photoresist film to form a space exposing the insoluble polymer thin film in the exposed area and a photoresist pattern integrally connected to the insoluble polymer thin film, exposing the acid-extinguisher containing film through the space by removing the insoluble polymer thin film, and removing the acid-extinguisher containing film exposed through the space.

The method may further include washing a surface of the insoluble polymer thin film and a surface of the photoresist pattern before exposing the acid-extinguisher containing film and after developing the film. The method may further include drying the washed insoluble polymer thin film and the washed photoresist pattern before exposing the acid-extinguisher containing film and after washing the surface of the insoluble polymer thin film and the surface of the photoresist pattern.

The potential acid may include one of a photoacid generator (PAG), a thermoacid generator (TAG), and a mixture thereof. The acid-extinguisher containing film may include a basic material. The acid-extinguisher containing film may include a basic material having a boiling point higher than 120° C.

Forming the acid-extinguisher containing film may include applying a mixed solution of a basic material and a solvent onto the substrate. The mixed solution may further contain a matrix polymer. Forming the acid-extinguisher containing film may further include supplying a gas-phase basic material onto the substrate.

Forming the acid-extinguisher containing film may include forming a basic material layer using one of an atomic layer deposition (ALD) process, a chemical vapor deposition (CVD) process, and a physical vapor deposition (PVD) process.

The acid-extinguisher containing film may include a basic material, and forming the insoluble polymer thin film may include extinguishing the acids of the exposed area by diffusing the basic material from the acid-extinguisher containing film to the exposed area.

According to example embodiments of the inventive concepts, a method of forming a micro pattern of a semiconductor device may include forming an acid-extinguisher containing film on a substrate including a portion to be etched, forming a photoresist film on the acid-extinguisher containing film, exposing a portion of the photoresist film to light, forming an insoluble polymer thin film in an exposed area of the photoresist film, the insoluble polymer thin film being in contact with the acid-extinguisher containing film, forming a photoresist pattern integrally connected to the insoluble polymer thin film by developing the photoresist film, exposing the acid-extinguisher containing film by etching the insoluble polymer thin film using the photoresist pattern as an etching mask, exposing the portion of the substrate to be etched by etching the acid-extinguisher containing film using the photoresist pattern as an etching mask, and etching the portion of the substrate to be etched using the photoresist pattern as an etching mask.

A dry etching process may be performed to remove the insoluble polymer thin film. Exposing a portion of the photoresist film may include generating acids within the exposed area of the photoresist film by the exposure, and forming the insoluble polymer thin film may include extinguishing the acids within the exposed area by diffusing an acid-extinguisher from the acid-extinguisher containing film to the exposed area of the photoresist film.

The acid-extinguisher containing film may include a basic material, and the method may further include heating the photoresist film at a temperature lower than a boiling point of the basic material included in the acid-extinguisher containing film before exposing a portion of the photoresist film to light and after forming the photoresist film.

According to example embodiments, a method may include forming a photoresist film on a lower film, exposing a portion of the photoresist film to light, forming an upper film in the exposed portion of the photoresist film such that the upper film is in contact with the lower film, the upper film being insoluble in an alkaline aqueous solution, forming a photoresist pattern integrally connected to the upper film by developing the photoresist film, and exposing the lower film by removing the upper film using the photoresist pattern as an etching mask.

The lower film may be exposed by removing the upper film using a dry etching process. Exposing the portion of the photoresist film may include generating acids within the exposed portion of the photoresist film, and forming the upper film may include extinguishing the acids within the exposed portion by diffusing an acid-extinguisher from the upper film to the exposed portion of the photoresist film.

The method may further include washing a surface of the upper film and a surface of the photoresist pattern before exposing the lower film and after forming the photoresist pattern. The method may further include drying the washed upper film and the washed photoresist pattern before exposing the lower film and after washing the surface of the upper thin film and the surface of the photoresist pattern.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1A:
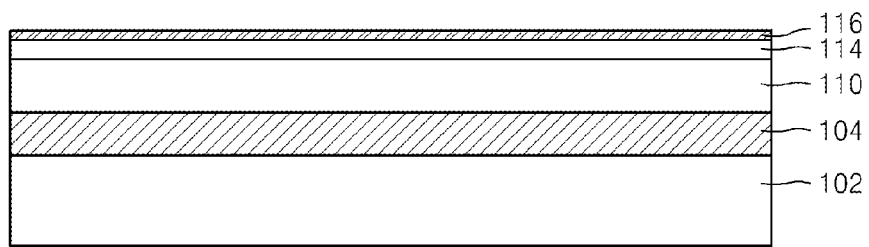
FIGS. 1A through 1J are cross-sectional views sequentially showing a method of forming a micro pattern of a semiconductor device, according to example embodiments of the inventive concepts.

Hereinafter, the inventive concepts will be described in detail by explaining example embodiments with reference to the attached drawings. Like reference numerals in the drawings denote like elements, and thus their description will be omitted.

The inventive concepts may, however, be embodied in many different forms and should not be construed as limited to example embodiments set forth herein. Rather, these example embodiments are provided so that this disclosure will be thorough and complete, and will fully convey the scope of the inventive concepts to those skilled in the art. In the drawings, lengths and sizes of layers and regions may be exaggerated for clarity.

Also, though terms like 'first' and 'second' are used to describe various elements, components, regions, layers, and/or portions in various example embodiments of the inventive concepts, the elements, components, regions, layers, and/or portions should not be limited by these terms. These terms are only used to distinguish one element, component, region, layer, or portion from another. Thus, a first element, component, region, layer or section discussed below could be termed a second element, component, region, layer or section without departing from the teachings of example embodiments of the inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

When a certain embodiment can be embodied in a different manner, a specified process order may be performed in a different manner in order to be described. For example, two processes to be described sequentially may be substantially performed at the same time or may be performed in an order opposite to the order to be described.

As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

FIGS. 1A through 1J are cross-sectional views sequentially showing a method of forming a micro pattern of a semiconductor device, according to example embodiments of the inventive concepts.

Referring to FIG. 1A, an etching target film 104, a hard mask layer 110, an anti-reflective coating film 114, and an acid-extinguisher containing film 116 may be sequentially formed on a substrate 102.

In example embodiments, the substrate 102 may include silicon (Si), for example, crystalline Si, polycrystalline Si, or amorphous Si. In example embodiments, the substrate 102 may include a semiconductor, e.g., germanium (Ge), silicon germanium (SiGe), silicon carbide (SiC), gallium arsenide (GaAs), indium arsenide (InAs), or indium phosphide (InP). In example embodiments, the substrate 102 may have a silicon on insulator (SOI) structure. For example, the substrate 102 may include a buried oxide layer (BOX). In example embodiments, the substrate 102 may include a conductive area, for example, a well doped with impurities or a structure doped with impurities.

The etching target film 104 may be an insulating film or a conductive film. For example, the etching target film 104 may be formed of an oxide film, a nitride film, an oxynitride film, a carbonized film, a metal, a metal nitride, or a semiconductor, but example embodiments of the inventive concepts are not limited thereto.

The hard mask layer 110 may be formed of a material capable of providing an etching selection ratio between the hard mask layer 110 and the etching target film 104. For example, the hard mask layer 110 may be formed of an oxide film, a nitride film, an oxynitride film, a SiCN film, a metal nitride film, a polysilicon film, an amorphous carbon layer (ACL), or a spin on hard mask (SOH) which is formed of a hydrocarbon compound or a derivative thereof with a relatively high carbon content of about 85% by weight to about 99% by weight. The hard mask layer 110 may be constituted by a single layer, or a multiple layer in which a plurality of different types of layers are sequentially stacked. In example embodiments, the hard mask layer 110 may be omitted.

The anti-reflective coating film 114 may prevent or inhibit total reflection of light during a subsequent exposure process. The anti-reflective coating film 114 may be formed of any material, as long as the material is used in an ordinary photolithography process. In example embodiments, the anti-reflective coating film 114 may be formed of an organic anti-reflective coating (ARC) material for a KrF excimer laser, an ArF excimer laser, or an arbitrary light source. The anti-reflective coating film 114 may be formed of an ARC material used in a dry lithography process or an ARC material used in an immersion lithography process. For example, the anti-reflective coating film 114 may be formed of at least one organic ARC material selected from the "NCA" series and "NCST" series (trade names; manufactured by Nissan Chemical Industries, Ltd.), "XP" series (a trade name; manufactured by Rohm and Haas Electronic Materials (RHEM)), and "SNSA" series (a trade name; manufactured by Shin-Etsu Chemical Co. Ltd.)

In example embodiments, the anti-reflective coating film 114 may be formed of a material that is not dissolved in a basic aqueous solution. For example, the anti-reflective coating film 114 may be formed of titanium, titanium dioxide, titanium nitride, chromic oxide, carbon, silicon nitride, silicon oxynitride, amorphous silicon, or a mixture thereof. In example embodiments, a case where the anti-reflective coating film 114 is formed of a material that is not dissolved in a basic aqueous solution will be described. However, example embodiments of the inventive concepts are not limited thereto.

The acid-extinguisher containing film 116 may contain a basic material. In example embodiments, the acid-extinguisher containing film 116 may contain a basic material having a boiling point that is higher than 120° C. under 1 atmosphere. In example embodiments, the basic material contained within the acid-extinguisher containing film 116 may contain at least one of primary amine, secondary amine, and tertiary amine. For example, the basic material may include triethanolamine, triethyl amine, tributylamine, tripropyl amine, hexamethyldisilazane, or a mixture thereof.

In example embodiments, the acid-extinguisher containing film 116 may include a basic material of about 10 to about 100 volume %. In example embodiments, the acid-extinguisher containing film 116 may have a thickness of about 1 to about 150 Å.

In example embodiments, in order to form the acid-extinguisher containing film 116, a mixed solution including the basic material described above and a solvent may be applied onto the anti-reflective coating film 114 on the substrate 102 under a temperature of about 10 to about 50° C., and the solvent may be volatilized and dried. When the anti-reflective coating film 114 is omitted, the basic solution may be applied onto the hard mask layer 110. A process of applying the mixed solution and a process of volatilizing the solvent may be performed while being exposed to air.

A solvent contained in the mixed solution may be constituted by an organic solvent, but example embodiments of the inventive concepts are not limited thereto. For example, the solvent may be ethanol, isopropyl alcohol, acetone, ethyl lactate (EL), propylene glycol monomethyl ether acetate (PGMEA), propylene glycol methyl ether (PGME), 3-methoxy-3-methyl-1-butanol, and/or gamma-butyrolacetone.

In example embodiments, the basic material of about 10 to about 90% by weight may be contained in the mixed solution.

In example embodiments, the mixed solution may further include a matrix polymer. The matrix polymer may be formed of polyhydroxystyrene (PHS), poly(methyl methacrylate), or a mixture thereof. The matrix polymer of about 0 to about 70% by weight may be contained.

Any of various methods may be used to apply the mixed solution onto the substrate 102. For example, a spin coating process, a puddle process, a spaying process, or an immersion process may be used. When the mixed solution is applied onto the substrate 102, the substrate 102 may be maintained to a temperature of about 10 to about 100° C.

In example embodiments, in order to form the acid-extinguisher containing film 116, the basic material described above may be supplied in a gas phase onto the anti-reflective coating film 114 on the substrate 102. When the anti-reflective coating film 114 is omitted, the gas-phase basic material may be supplied onto the hard mask layer 110. In example embodiments, amine gas may be supplied onto the substrate 102 to form the acid-extinguisher containing film 116.

When the gas-phase basic material is supplied onto the substrate 102, a pure basic material, for example, a pure amine gas, may be separately supplied. Alternatively, the gas-phase basic material, e.g., amine gas, may be supplied together with an inert gas, e.g., $N_2$ or Ar.

In example embodiments, a process of supplying the gas-phase basic material onto the substrate 102 may be performed at a room temperature or under a temperature of about 200° C.

In example embodiments, a deposition process may be used to form the acid-extinguisher containing film 116. For example, an amine-containing layer or an amine derivative-containing layer may be formed on the substrate 102 through an atomic layer deposition (ALD) process, a chemical vapor deposition (CVD) process, or a physical vapor deposition (PVD) process, thereby forming the acid-extinguisher containing film 116 having a thickness of about 3 to about 50 Å.

In example embodiments, the anti-reflective coating film 114 may contain a basic material. In example embodiments, the basic material contained in the anti-reflective coating film 114 may have a boiling point that is higher than 120° C. In order to form the anti-reflective coating film 114 containing the basic material, a mixture of a precursor of the anti-reflective coating film 114 and the basic material may be supplied onto the hard mask layer 110. The basic material that may be contained in the anti-reflective coating film 114 is not particularly limited, and any of various types of basic materials capable of increasing a basic concentration within the anti-reflective coating film 114 may be used. In example embodiments, the basic material contained in the anti-reflective coating film 114 may be the same as the basic material contained in the acid-extinguisher containing film 116. For example, the basic material may include at least one of primary amine, secondary amine, and tertiary amine.

When the basic material is contained in the anti-reflective coating film 114, it is possible to prevent or inhibit the basic material within the acid-extinguisher containing film 116 in a resultant material in which the acid-extinguisher containing film 116 is formed on the anti-reflective coating film 114 from diffusing into the anti-reflective coating film 114, thereby preventing or inhibiting the basic concentration from being decreased within the acid-extinguisher containing film 116. In example embodiments, the anti-reflective coating film 114 may be formed to have a thickness of about 20 nm to about 150 nm.

In example embodiments, the anti-reflective coating film 114 may be omitted. When the anti-reflective coating film 114 is omitted, the acid-extinguisher containing film 116 may be formed directly on the hard mask layer 110. In example embodiments, the hard mask layer 110 may contain a basic material. A detailed description about a basic material that may be contained in the hard mask layer 110 is the same as the basic material that may be contained in the anti-reflective coating film 114. In order to form the hard mask layer 110 containing the basic material, a mixture of a precursor of the hard mask layer 110 and the basic material may be supplied onto the etching target film 112. In example embodiments, the basic material contained in the hard mask layer 110 may be the same as the basic material contained in the acid-extinguisher containing film 116. When the basic material is contained in the hard mask layer 110, the basic material within the acid-extinguisher containing film 116 may be prevented or inhibited from diffusing into the hard mask layer 110, thereby preventing or inhibiting a basic concentration within the acid-extinguisher containing film 116 from being decreased.

Figure 1B:
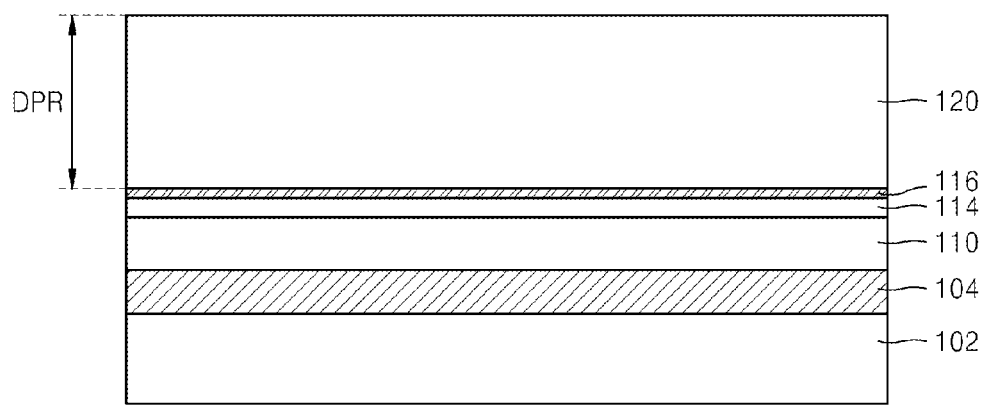

Referring to FIG. 1B, a photoresist film 120 may be formed on the acid-extinguisher containing film 116. A thickness (DPR) of the photoresist film 120 may be about twice or three times a width WPR of a photoresist pattern 120P (see FIG. 1F) to be formed from the photoresist film 120. In example embodiments, when the width WPR of the photoresist pattern 120P to be formed is about 10 to about 20 nm, the photoresist film 120 may be formed to have a thickness of about 20 to about 90 nm.

The photoresist film 120 may be formed of a positive-type photoresist. In example embodiments, the photoresist film 120 contains a resin whose polarity increases by the action of acid. For example, the photoresist film 120 may be constituted by a resin containing an acid degradable protecting group, and a chemically amplified photoresist containing a photoacid generator (PAG). The photoresist film 120 may be constituted by a resist for EUV (13.5 nm), a resist for an $F_2$ excimer laser (157 nm), a resist for an ArF excimer laser (193 nm), or a resist for a KrF excimer laser (248 nm). The photoresist film 120 may be formed using a spin coating process.

The process of forming the photoresist film 120 may include a process of spin-coating a photoresist composition containing a photosensitive polymer with an acid-labile group, a potential acid, and a solvent on the acid-extinguisher containing film 116.

In example embodiments, the photosensitive polymer may include a methacrylate-based polymer. The methacrylate-based polymer may be an aliphatic methacrylate-based polymer. For example, the photosensitive polymer may be poly-methylmethacrylate (PMMA), poly(t-butyl methacrylate), poly(methacrylic acid), poly(norbornylmethacrylate), a copolymer or terpolymer of repeating units of the methacrylate-based polymers, or a mixture thereof. In addition, these may be replaced by various acid-labile protecting groups. The protecting groups may include a tertbutoxycarbonyl (t-BOC) group, a tetrahydropyranyl group, a trimethylsilyl group, a phenoxyethyl group, a cyclohexenyl group, a tert-butoxycarbonylmethyl group, a tert-butyl group, an adamantly group, or a norbornyl group. However, example embodiments of the inventive concepts are not limited thereto.

In example embodiments, the potential acid may be constituted by a PAG, a thermoacid generator (TAG), or a mixture thereof. In example embodiments, the PAG may be constituted by a material that generates acid when the material is exposed by any one selected from a EUV light beam (1 to 31 nm), an F2 excimer laser (157 nm), an ArF excimer laser (193 nm), and a KrF excimer laser (248 nm). The PAG may be constituted by nitrobenzyl esters, alkyl sulfonates, diazo naphthoquinones, imino sulfonates, disulfones, diazomethanes, and/or sulfonyl ketones. For example, the PAG may be constituted by trimethylsulfonium triflate, methyl-tetrahydrothiophene triflate, methylpentahydrothiopyran triflate, methyl-tetrahydrothiopyran-4-one triflate, or methyldithiane triflate. However, example embodiments of the inventive concepts are not limited thereto. The PAG may be contained in the photoresist composition in an amount of about 0.1 to about 40% by weight based on the gross weight of the photosensitive polymer.

The TAG may be constituted by an aliphatic or alicyclic compound. For example, the TAG may be constituted by at least one compound selected from the group consisting of carbonate ester, sulfonate ester, and phosphate ester. As a more detailed example, the TAG may be constituted by at least one compound selected from the group consisting of cyclohexyl nonafluorobutanesulfonate, norbornyl nonafluorobutanesulfonate, tricyclodecanyl nonafluorobutanesulfonate, adamantyl nonafluorobutanesulfonate, cyclohexyl nonafluorobutanecarbonate, norbornyl nonafluorobutanecarbonate, tricyclodecanyl nonafluorobutanecarbonate, adamantyl nonafluorobutanecarbonate, cyclohexyl nonafluorobutanephosphonate, norbornyl nonafluorobutanephosphonate, tricyclodecanyl nonafluorobutanephosphonate, and adamantyl nonafluorobutanephosphonate.

The solvent contained in the photoresist composition may be constituted by ethyleneglycolmonoethyl ether, ethyleneglycolmonomethyl ether, diethyleneglycolmonoethyl ether, propyleneglycolmonomethyl etheracetate (PGMEA), toluene, xylene, methyl ethyl ketone, cyclohexanone, 2-hydroxypropionethyl, 2-hydroxy-2-methyl ethyl propionate, ethoxy ethyl acetate, hydroxyl ethyl acetate, 2-hydroxy-3-methyl methylbutanoic acid, 3-methoxy-2-methyl methyl propionate, 3-ethoxyethyl propionate, 3-methoxy 2-methyl ethyl propionate, ethyl acetate, butyl acetate, or a mixture thereof.

In example embodiments, the photoresist composition may further include an organic base in an amount of about 0.1 to 10% by weight based on the gross weight of the photosensitive polymer. For example, the organic base may be constituted by triethylamine, triisobutylamine, triisooctylamine, diethanolamine, triethanolamine, or a mixture thereof.

In order to form the photoresist film 120, the photoresist composition may be coated on the substrate 102, and a soft baking process that heats the resultant for about 30 seconds to about 5 minutes at a temperature of about 90 to 120° C. may be performed.

When the acid-extinguisher containing film 116 contains a basic material with a boiling point higher than 120° C., the soft baking process may be performed at a temperature equal to or lower than 120° C., which is lower than the boiling point of the basic material, thereby stabling maintaining the basic material within the acid-extinguisher containing film 116.

Figure 1C:
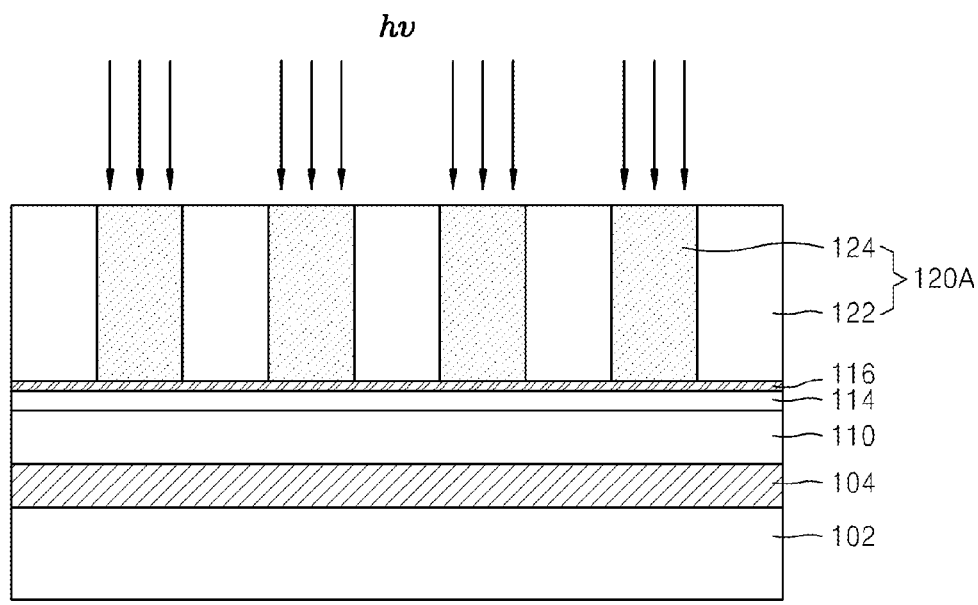

Referring to FIG. 1C, a part of the photoresist film 120 (see FIG. 1B) may be exposed so as to form a non-exposed area 122 and an exposed photoresist film 120A including an exposed area 124 containing acids.

The exposure may be performed using a EUV light beam, an $F_2$ excimer laser (157 nm), an ArF excimer laser (193 nm), or a KrF excimer laser (248 nm). When a plurality of line and space patterns with a width of, for example, about several tens of nm are to be formed, an EUV lithography process using an EUV light beam may be used. In the EUV lithography process, a light beam with a wavelength of an X-ray area or a vacuum ultraviolet area, for example, about 10 to 20 nm, in particular, a light beam with a wavelength of 13.5 nm±0.3 nm may be used. When the exposure is performed using the EUV light beam, a reflecting optical system, including a reflective photo mask and mirrors, may be used.

As a result of the exposure performed on the photoresist film 120, the exposed area 124 of the exposed photoresist film 120A contains acids generated from the PAG and/or the TAG. A post exposure baking (PEB) process may be performed on the exposed photoresist film 120A. The acids may be diffused up to a bottom surface of the exposed area 124 within the exposed area 124 by the PEB process. In example embodiments, the PEB process may be performed at a temperature of about 70 to about 150° C. for about 30 to 120 seconds.

Figure 1D:
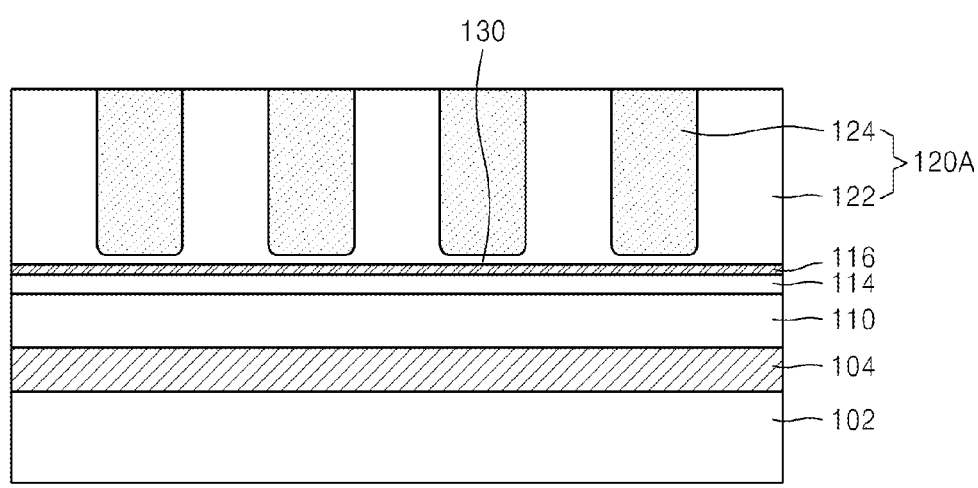

Referring to FIG. 1D, an insoluble polymer thin film 130 may be formed between the acid-extinguisher containing film 116 and the exposed area 124 by extinguishing the acids within the exposed area 124 at an interface between the acid-extinguisher containing film 116 and the exposed area 124.

The insoluble polymer thin film 130 may be an insoluble film that is not dissolved in an alkaline aqueous solution. The insoluble polymer thin film 130 may not be dissolved in a basic solution, e.g., tetramethylammonium hydroxide (TMAH), potassium hydroxide, or sodium hydroxide. The insoluble polymer thin film 130 may be connected integrally to the non-exposed area 122 of the photoresist film 120A.

In example embodiments, in order to form the insoluble polymer thin film 130, the basic material within the acid-extinguisher containing film 116 may be diffused to the exposed area 124. In example embodiments, the diffusion of the basic material from the acid-extinguisher containing film 116 to the exposed area 124 may be performed during the PEB process described with reference to FIG. 1C.

In example embodiments, in order to diffuse the basic material from the acid-extinguisher containing film 116 to the exposed area 124, the resultant in which the exposed area 124 is formed may be maintained under a temperature of about 10 to about 100° C. for a predetermined or given time, for example, about 1 to 30 minutes, after the PEB process described with reference to FIG. 1C.

The basic material may be diffused from the acid-extinguisher containing film 116 to the exposed area 124, and thus acids located adjacent to the interface between the acid-extinguisher containing film 116 and the exposed area 124 in the exposed area 124 are extinguished by the basic material diffused from the acid-extinguisher containing film 116. As a result, the insoluble polymer thin film 130 may be formed between the acid-extinguisher containing film 116 and the exposed area 124. The thickness of the insoluble polymer thin film 130 may depend on a diffusion distance of the basic material diffused from the acid-extinguisher containing film 116.

In example embodiments, the insoluble polymer thin film 130 may have a thin linear shape that comes into contact with the acid-extinguisher containing film 116 and extends along a top surface of the acid-extinguisher containing film 116. For example, the insoluble polymer thin film 130 may have a thickness of about 1 to 10 nm, but example embodiments of the inventive concepts are not limited thereto.

FIG. 1D shows the insoluble polymer thin film 130 that is continuous between a plurality of the non-exposed areas 122 without a break, but example embodiments of the inventive concepts are not limited thereto. For example, the insoluble polymer thin film 130 may include at least one opening that is partially formed.

Figure 1E:
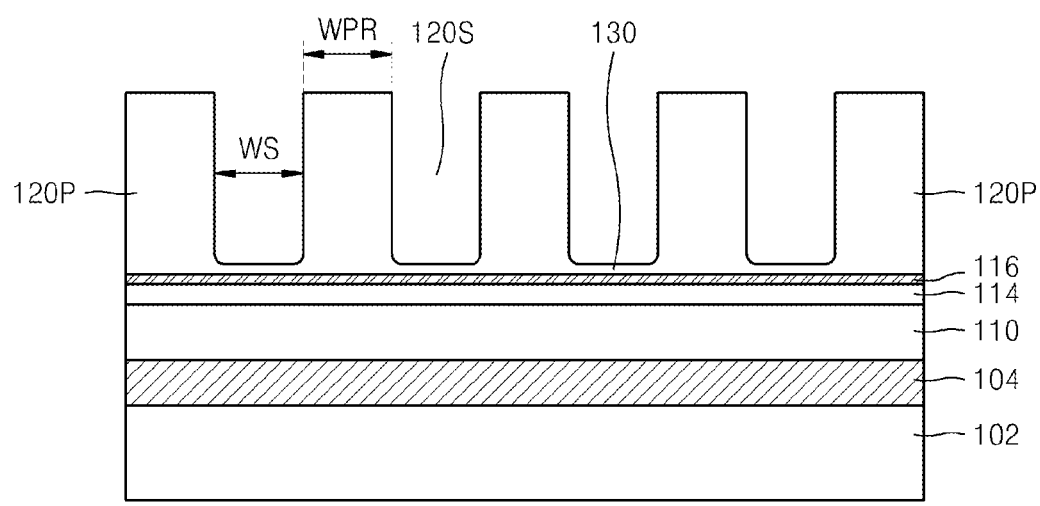

Referring to FIG. 1E, a space 120S exposing the insoluble polymer thin film 130 and a photoresist pattern 120P that is connected integrally to the insoluble polymer thin film 130 are formed by developing the photoresist film 120A (see FIG. 1D).

The developing process may be performed using an alkaline aqueous solution. For example, the developing process may be performed using a TMAH solution of about 2.38% by weight.

In example embodiments, the photoresist pattern 120P may have a width WPR corresponding to a half pitch of about 10 to 30 nm. The photoresist pattern 120P may be constituted by a plurality of lines and a plurality of space patterns that are repeatedly formed with regular widths WPR and at regular intervals WS.

A washing process or a rinsing process that uses pure water may be performed on a surface of the photoresist pattern 120P and a surface of the insoluble polymer thin film 130 that are obtained after the developing process. In addition, a dry process may be performed for removing moisture from the surface of the photoresist pattern 120P and the surface of the insoluble polymer thin film 130 that have undergone the washing process or the rinsing process. In example embodiments, the dry process may be performed using a method of placing the substrate 102 on a wafer chuck and rotating the wafer chuck. In example embodiments, the dry process may be performed using a method of supplying an inert gas, e.g., $N_2$, onto the surface of the photoresist pattern 120P and the surface of the insoluble polymer thin film 130 that have undergone the washing process or the rinsing process.

Since the photoresist pattern 120P is connected integrally to the insoluble polymer thin film 130, a contact area between the insoluble polymer thin film 130 and the acid-extinguisher containing film 116 disposed under the insoluble polymer thin film 130 may perform an advantageous function in improving adhesion between the photoresist pattern 120P and the acid-extinguisher containing film 116. Thus, even when a developing solution used during the developing of the photoresist film 120A has a relatively great surface tension, the photoresist pattern 120P may be prevented or inhibited from collapsing or tilting during the developing of the photoresist film 120A. In addition, even while the washing or rinsing process and the dry process are performed after the photoresist pattern 120P is obtained by the developing process, the photoresist pattern 120P does not collapse or tilt by the improved adhesion with respect to the lower structure of the photoresist pattern 120P.

Figure 1F:
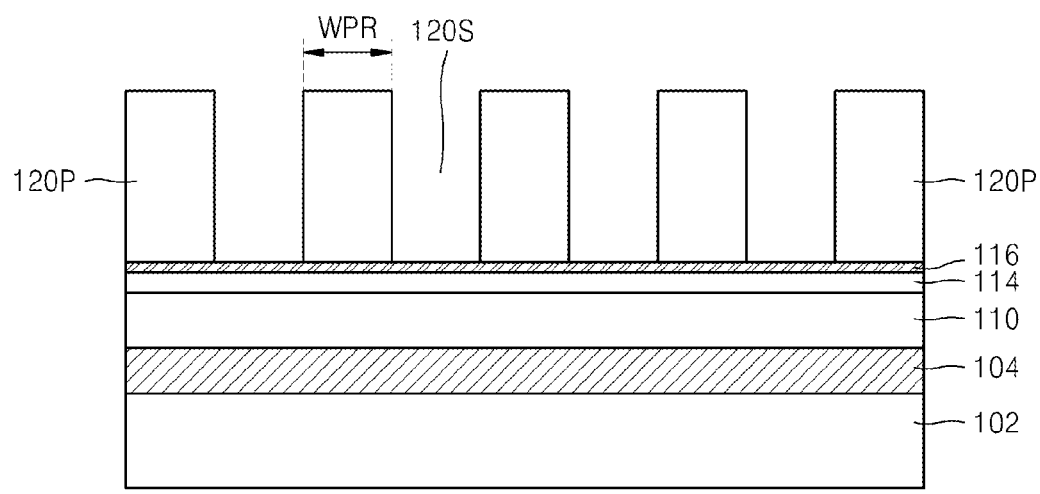

Referring to FIG. 1F, the acid-extinguisher containing film 116 is exposed through the space 120S by removing the insoluble polymer thin film 130 (see FIG. 1E) exposed through the space 120S.

The insoluble polymer thin film 130 may be removed using a dry etching process that uses the photoresist pattern 120P as an etching mask. In example embodiments, a part of the photoresist pattern 120P may be consumed while the insoluble polymer thin film 130 is removed, and thus the photoresist pattern 120P may have a reduced height.

Figure 1G:
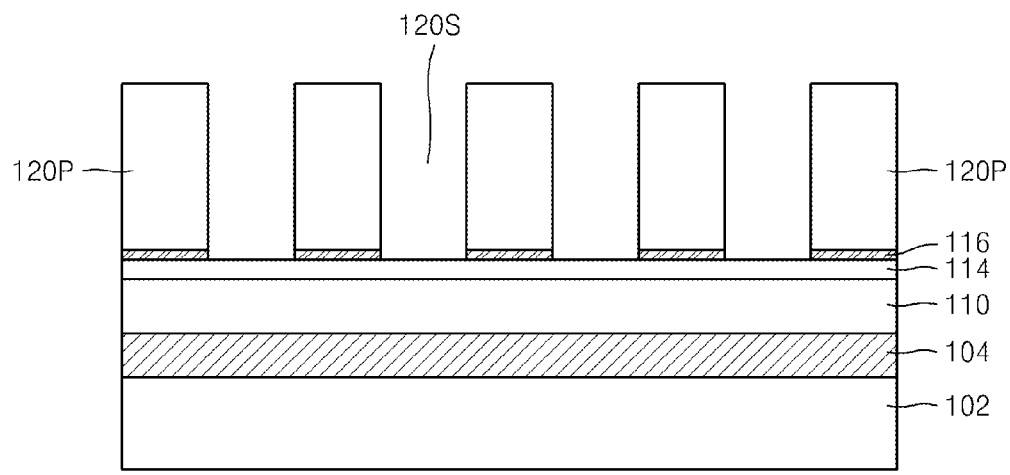

Referring to FIG. 1G, portions of the acid-extinguisher containing film 116, which are exposed through the space 120S, are removed so as to expose the anti-reflective coating film 114 through the space 120S.

The acid-extinguisher containing film 116 may be removed using a dry etching process that uses the photoresist pattern 120P as an etching mask. In example embodiments, a dry etching process for removing the insoluble polymer thin film 130 and a dry etching process for removing the acid-extinguisher containing film 116 may be continuously performed in situ within the same etching chamber.

Figure 1H:
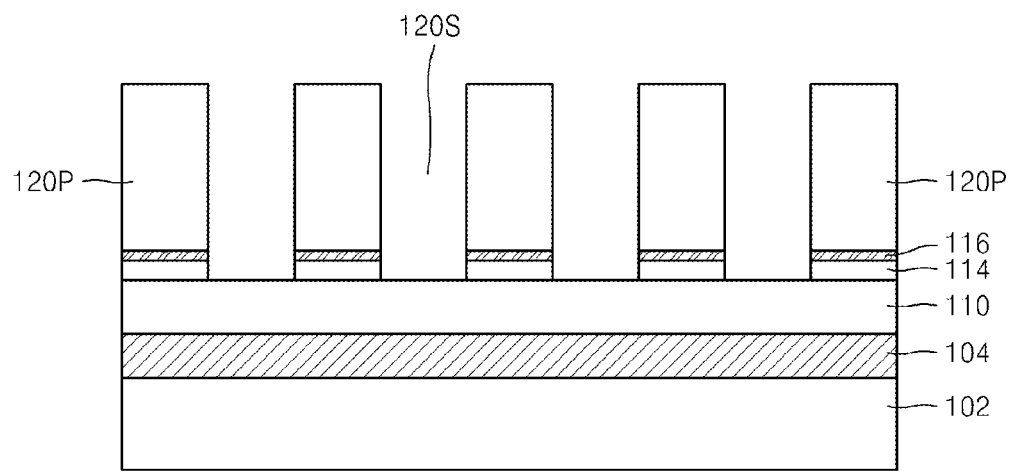

Referring to FIG. 1H, anisotropic etching may be performed on the anti-reflective coating film 114 exposed through the space 120S by using the photoresist pattern 120P as an etching mask so as to expose the hard mask layer 110 through the space 120S.

Figure 1I:
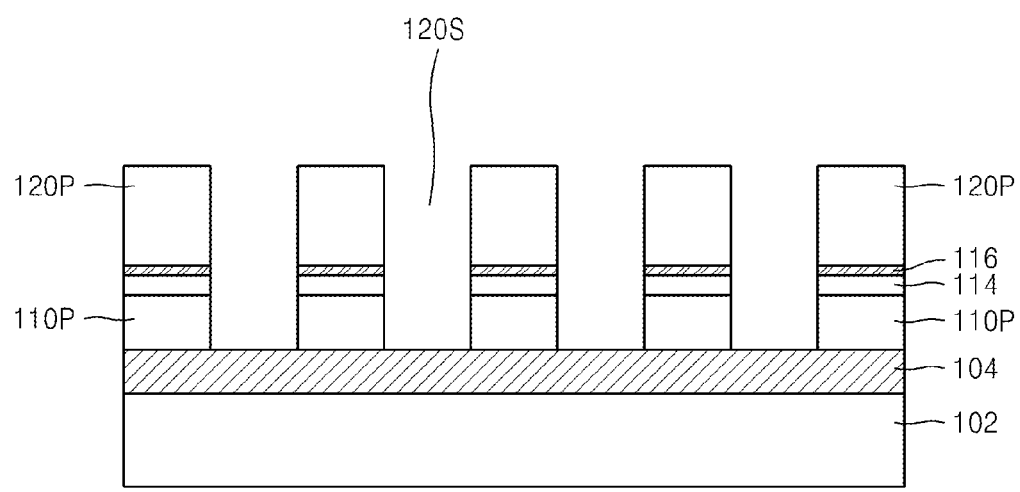

Referring to FIG. 1I, a hard mask pattern 110P is formed by performing anisotropic etching on the hard mask layer 110 exposed through the space 120S by using the photoresist pattern 120P as an etching mask, and the etching target film 104 is exposed through the space 120S.

The photoresist pattern 120P may be partially removed while the hard mask layer 110 is etched to form the hard mask pattern 110P, and thus the photoresist pattern 120P may have a reduced thickness.

Figure 1J:
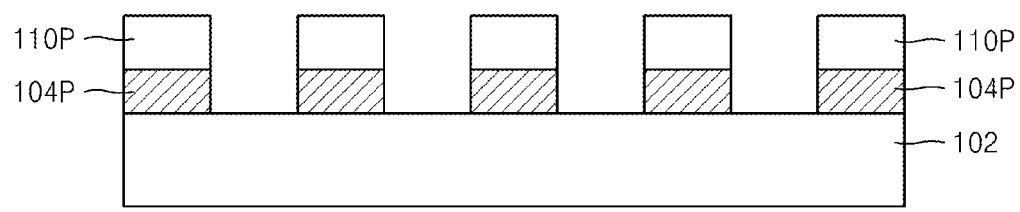

Referring to FIG. 1J, anisotropic etching is performed on the etching target film 104 by using the photoresist pattern 120P and the hard mask pattern 110P that remain on the hard mask pattern 110P as etching masks, thereby forming a micro pattern 104P.

According to the method of forming a micro pattern of a semiconductor device of example embodiments of the inventive concepts which is described with reference to FIGS. 1A to 1J, the insoluble polymer thin film 130 coming into contact with a lower film of the photoresist pattern 120P in a space of the photoresist pattern 120P is connected integrally to the photoresist pattern 120P, and thus a contact area between the insoluble polymer thin film 130 and the lower film of the photoresist pattern 120P may perform an advantageous function in improving adhesion between the photoresist pattern 120P and the lower film. Thereby, the photoresist pattern 120P may be prevented or inhibited from collapsing or tilting during the developing process of the photoresist film 120A or the rinsing process after the developing process of the photoresist film 120A. In this manner, the collapse or tilting of the photoresist pattern 120P, which occurs when forming the micro pattern of the semiconductor device, may be controlled using the insoluble polymer thin film 130, thereby increasing the height of the photoresist pattern 120P so as to increase an aspect ratio of the photoresist pattern 120P. As a result, it is possible to improve an etching process margin when etching the lower films by using the photoresist pattern 120P as an etching mask.

Figure 2:
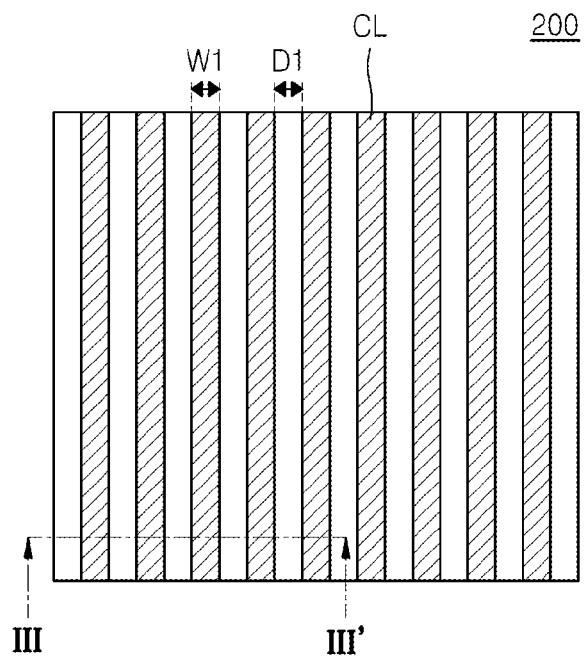
FIG. 2 is a diagram showing a layout of some components of a semiconductor device that may be embodied using a method of forming a micro pattern, according to example embodiments of the inventive concepts.

FIG. 2 is a diagram showing a layout of some components of a semiconductor device 200 that may be embodied using a method of forming a micro pattern, according to example embodiments of the inventive concepts.

A portion shown in FIG. 2 may be a high-density pattern area with a relatively high pattern density in the semiconductor device, for example, a cell array area in which unit memory devices are formed.

In FIG. 2, the semiconductor device 200 may include a plurality of conductive line patterns CL that have a first width W1, which is relatively narrow, and that extend to be parallel to each other. The plurality of conductive line patterns CL may be separated from each other by a first distance D1, which is relatively short. In the semiconductor device 200, the first width W1 and the first distance D1 may be arbitrarily designed according to the type of unit device to be formed and desired characteristics. For example, the first width W1 and the first distance D1 may have the same size. Alternatively, the first width W1 may be larger or smaller than the first distance D1. In example embodiments, the plurality of conductive line patterns CL may constitute a plurality of word lines or a plurality of bit lines that are disposed in a cell array area of a semiconductor memory device.

FIGS. 3A through 3I are cross-sectional views sequentially showing a method of forming a micro pattern of a semiconductor device, according to example embodiments of the inventive concepts.

The method of forming a micro pattern, according to example embodiments described with reference to FIGS. 3A to 3I, may be used to form the plurality of conductive line patterns CL of the semiconductor device 200 shown in FIG. 2. FIGS. 3A to 3I show a cross-sectional configuration of a portion corresponding to a cross-section along line III-III' of FIG. 2. In FIGS. 3A to 3I, the same reference numerals as those in FIGS. 1A to 1J denote the same components, and the detailed description thereof will not be repeated for convenience of description.

Figure 3A:
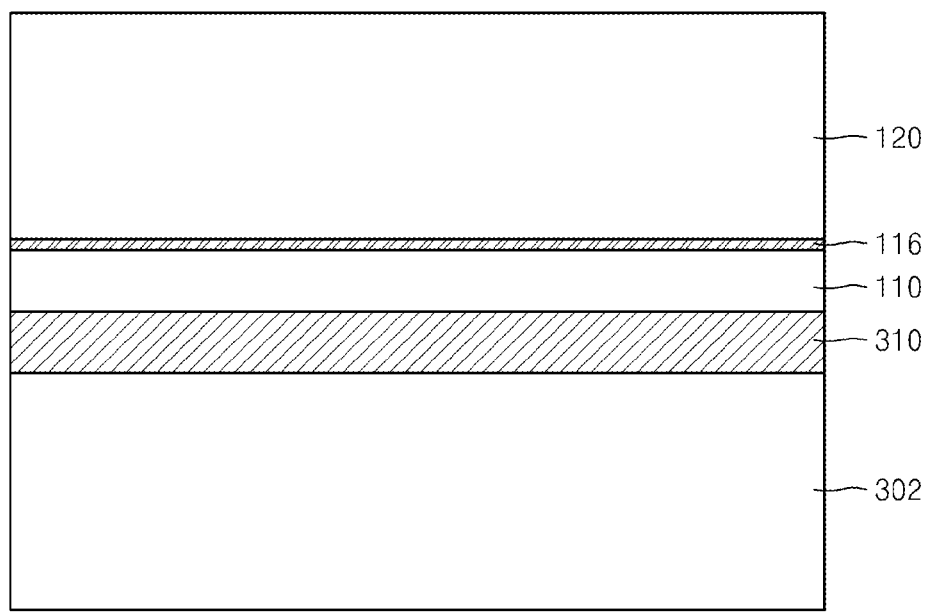
FIGS. 3A through 3I are cross-sectional views sequentially showing a method of forming a micro pattern of a semiconductor device, according to example embodiments of the inventive concepts.

Referring to FIG. 3A, a conductive layer 310 for forming a plurality of conductive line patterns may be formed on a substrate 302.

Thereafter, the hard mask layer 110, the acid-extinguisher containing film 116, and the photoresist film 120, which are described above with reference to FIGS. 1A and 1B, may be sequentially formed on the conductive layer 310. In example embodiments, a case where the anti-reflective coating film 114 shown in FIG. 1A is omitted will be described.

Details about the substrate 302 are the same as those about the substrate 102 which are described with reference to FIG. 1A.

The conductive layer 310 may be a conductive layer for forming a plurality of word lines or a plurality of bit lines in a cell array area of a semiconductor memory device. In example embodiments, the conductive layer 310 may be constituted by a doped polysilicon, a metal, a conductive metal nitride, a metal silicide, or a mixture thereof. When a plurality of word lines are formed from the conductive layer 310, the conductive layer 310 may contain a conductive material constituted by TaN, TiN, W, WN, HfN, tungsten silicide, or a mixture thereof. When a plurality of bit lines are formed from the conductive layer 310, the conductive layer 310 may be constituted by a doped polysilicon, a metal, a metal nitride, or a mixture thereof. For example, the conductive layer 310 may have a structure in which a doped polysilicon, TiN, and tungsten are sequentially stacked.

In example embodiments, the hard mask layer 110 may contain a basic material. In example embodiments, the basic material contained in the hard mask layer 110 may have a boiling point higher than 120° C. In order to form the hard mask layer 110 containing the basic material, a mixture of a precursor of the hard mask layer 110 and the basic material may be supplied onto the conductive layer 310. The basic material that may be contained in the hard mask layer 110 is not particularly limited, and any of various types of basic materials capable of increasing a basic concentration within the hard mask layer may be used. In example embodiments, the basic material contained in the hard mask layer 110 may be the same as the basic material contained in the acid-extinguisher containing film 116. For example, the basic material may contain at least one of primary amine, secondary amine, and tertiary amine.

When the hard mask layer 110 contains the basic material, it is possible to prevent or inhibit the basic material within the acid-extinguisher containing film 116 in a resultant material in which the acid-extinguisher containing film 116 is formed on the hard mask layer 110 from diffusing into the hard mask layer 110, thereby preventing or inhibiting the basic concentration from being decreased within the acid-extinguisher containing film 116 due to the above-mentioned diffusion of the basic material.

Figure 3B:
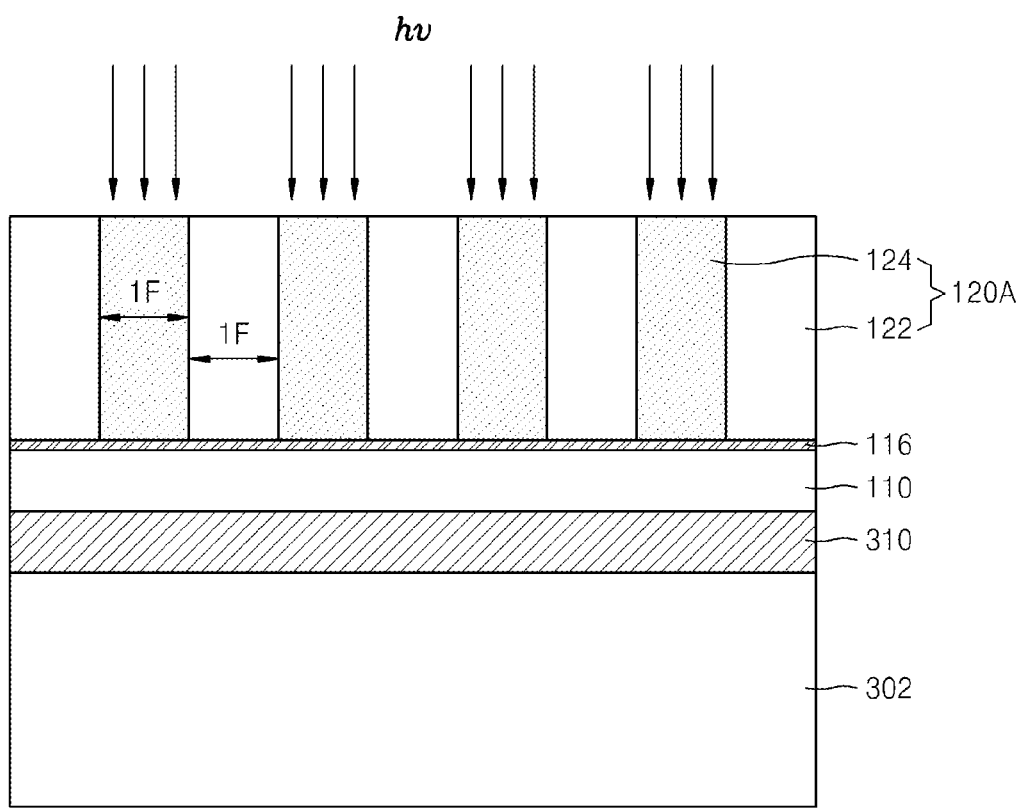

Referring to FIG. 3B, a part of the photoresist film 120 (see FIG. 3A) is exposed using the method described with reference to FIG. 1C so as to form the exposed photoresist film 120A including the non-exposed area 122 and the exposed area 124.

In example embodiments, the non-exposed area 122 and the exposed area 124 may have a 1F width, which is a minimum feature size of a semiconductor device.

Figure 3C:
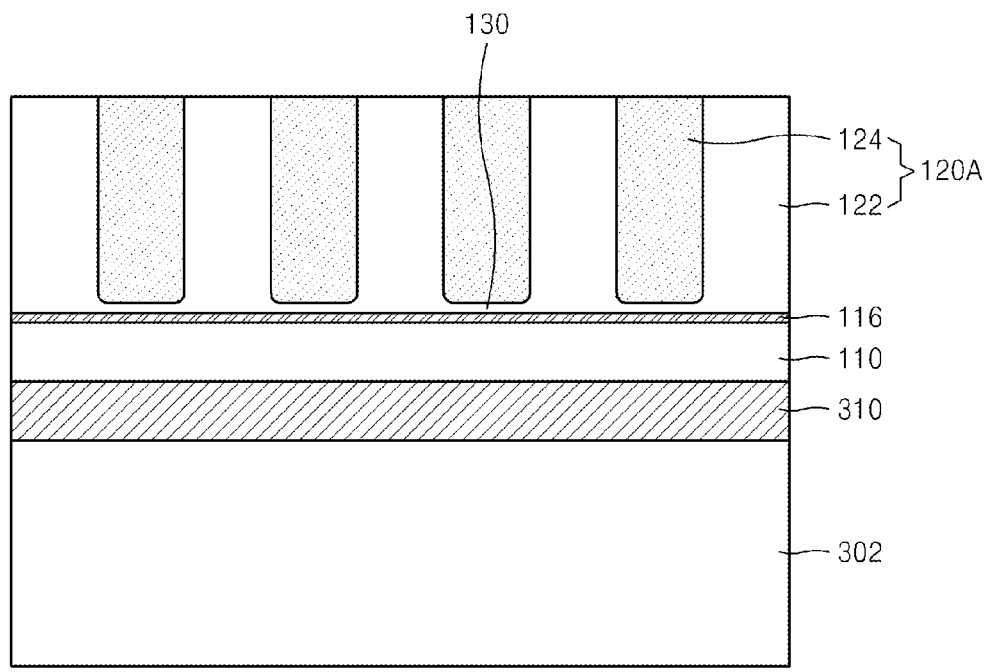

Referring to FIG. 3C, acids within the exposed area 124 are extinguished at an interface between the acid-extinguisher containing film 116 and the exposed area 124 by using the method described with reference to FIG. 1D so as to form the insoluble polymer thin film 130 between the acid-extinguisher containing film 116 and the exposed area 124.

Figure 3D:
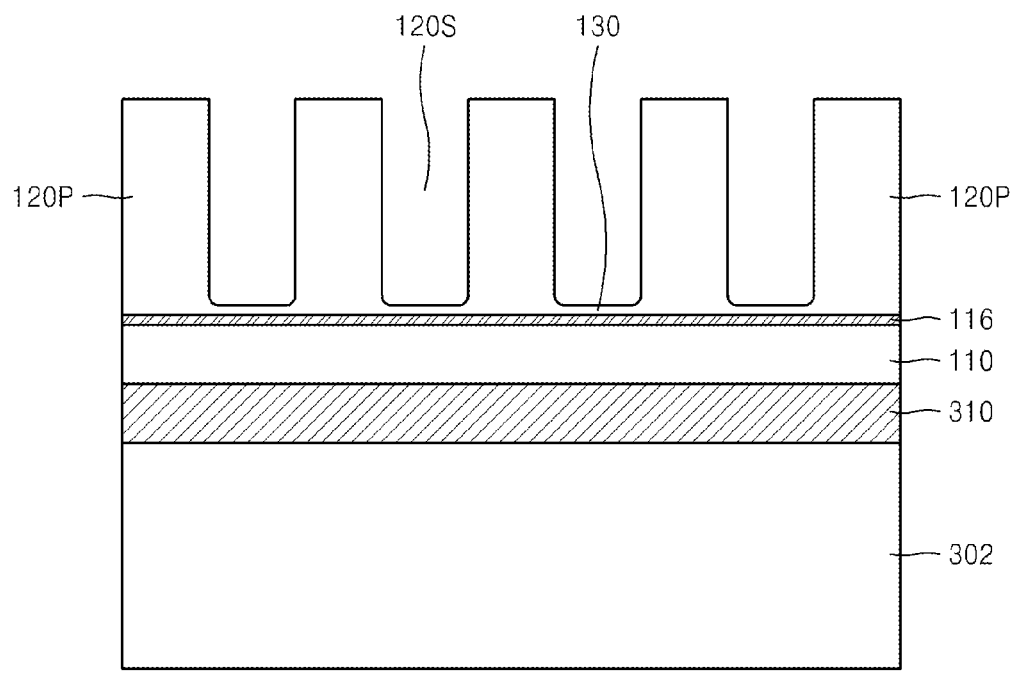

Referring to FIG. 3D, the exposed photoresist film 120A (see FIG. 3C) is developed using the method described with reference to FIG. 1E so as to form the space 120S exposing the insoluble polymer thin film 130 and the photoresist pattern 120P that is connected integrally to the insoluble polymer thin film 130.

A washing or rinsing process and a dry process may be performed on the surface of the photoresist pattern 120P and the surface of the insoluble polymer thin film 130 that are obtained after the developing, by using the method described with reference to FIG. 1E.

Since the photoresist pattern 120P is connected integrally to the insoluble polymer thin film 130, a contact area between the insoluble polymer thin film 130 and the acid-extinguisher containing film 116 may perform an advantageous function in improving adhesion between the photoresist pattern 120P and the acid-extinguisher containing film 116. Thus, the photoresist pattern 120P may be prevented or inhibited from collapsing or tilting while the photoresist pattern 120P undergoes the developing process for forming the photoresist pattern 120P and the washing and dry processes that are performed after the developing process.

Figure 3E:
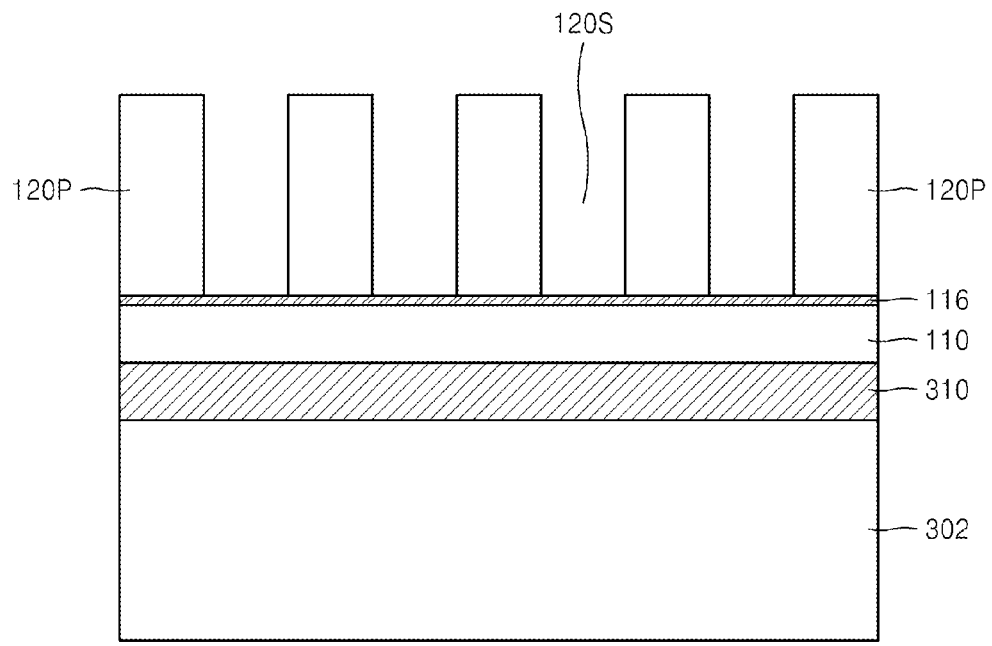

Referring to FIG. 3E, the insoluble polymer thin film 130 (see FIG. 3D) exposed through the space 120S is removed using the method described with reference to FIG. 1F so as to expose the acid-extinguisher containing film 116 through the space 120S. In example embodiments, a part of the photoresist pattern 120P may be consumed while the insoluble polymer thin film 130 is removed, and thus the photoresist pattern 120P may have a reduced height.

Figure 3F:
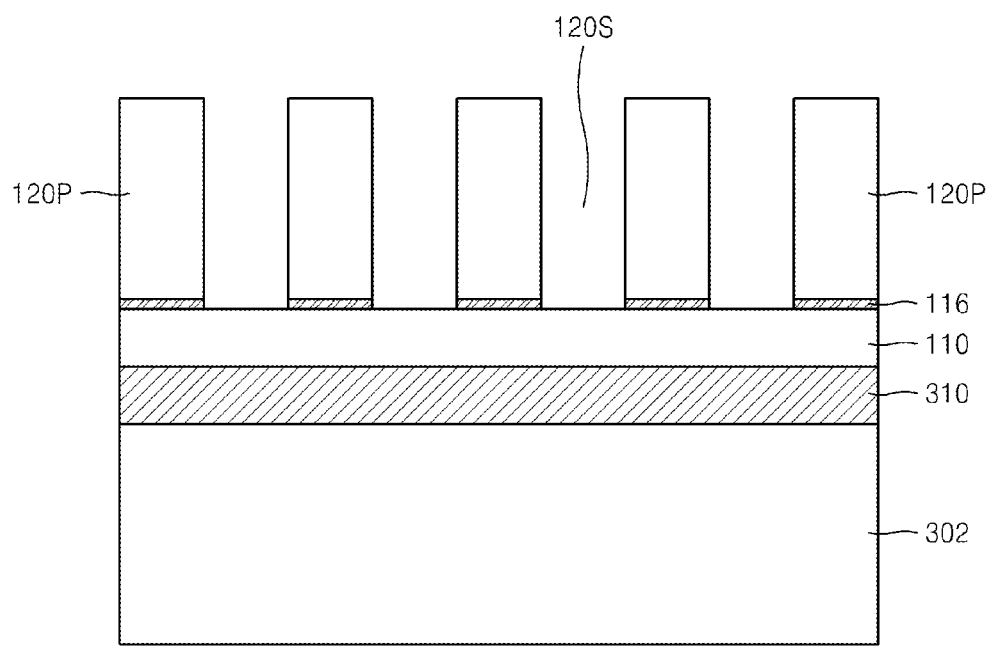

Referring to FIG. 3F, portions of the acid-extinguisher containing film 116, which are exposed through the space 120S, are removed using a method similar to that described above with reference to FIG. 1G so as to expose the hard mask layer 110 through the space 120S.

Figure 3G:
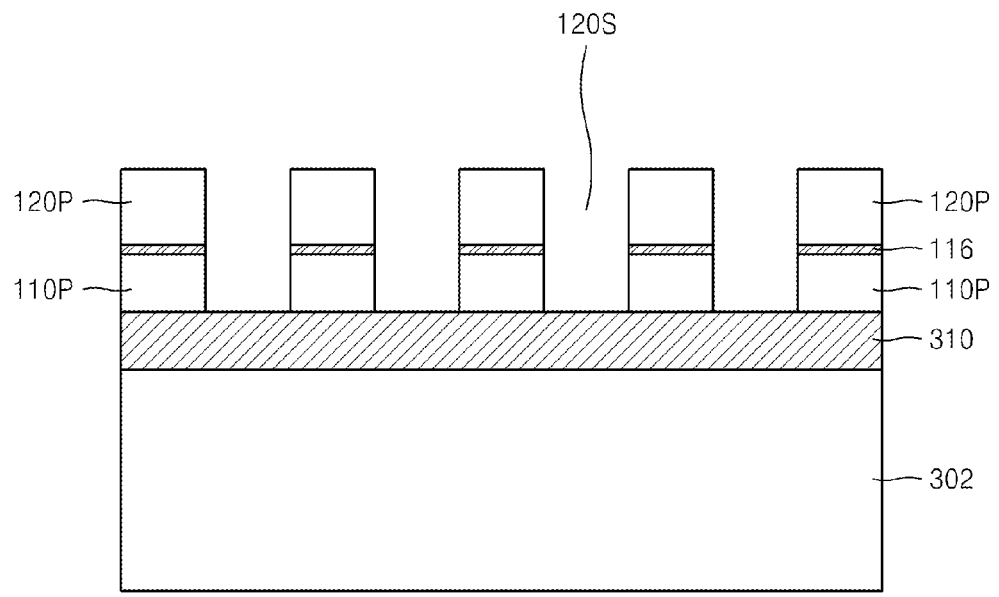

Referring to FIG. 3G, similarly to the method described with reference to FIG. 1I, anisotropic etching is performed on the hard mask layer 110 exposed through the space 120S by using the photoresist pattern 120P as an etching mask so as to form the hard mask pattern 110P and to expose the conductive layer 310 through the space 120S. The photoresist pattern 120P is consumed during the etching process of the hard mask layer 110 for forming the hard mask pattern 110P, and thus the photoresist pattern 120P may have a reduced thickness.

Figure 3H:
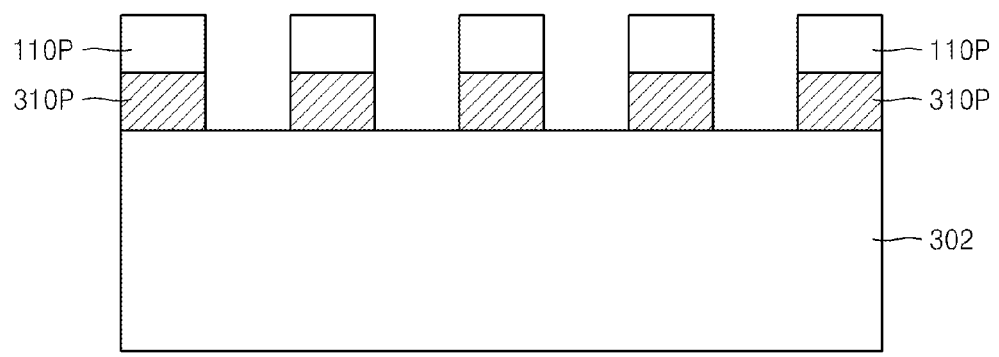

Referring to FIG. 3H, anisotropic etching is performed on the conductive layer 310 by using the photoresist pattern 120P and the hard mask pattern 110P as etching masks so as to form a plurality of conductive patterns 310P.

The photoresist pattern 120P and the acid-extinguisher containing film 116 may be consumed while the conductive layer 310 is etched in order to form the plurality of conductive patterns 310P. In FIG. 3H, the photoresist pattern 120P and the acid-extinguisher containing film 116 are completely consumed, and thus a top surface of the hard mask pattern 110P is exposed, but example embodiments of the inventive concepts are not limited thereto. In example embodiments, the acid-extinguisher containing film 116 or the photoresist pattern 120P may remain on the hard mask pattern 110P.

Figure 3I:
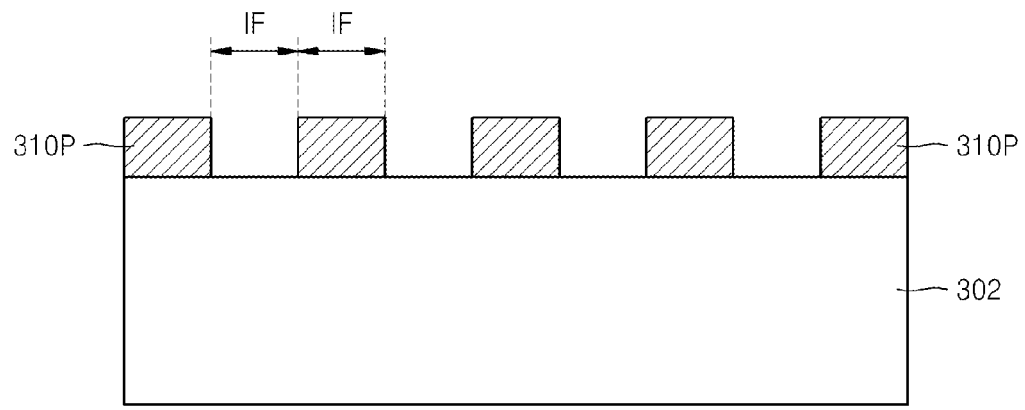

Referring to FIG. 3I, the hard mask pattern 110P remaining on the plurality of conductive patterns 310P is removed so as to expose top surfaces of the plurality of conductive patterns 310P.

In example embodiments, the process shown in FIG. 3I is omitted, and a subsequent semiconductor device manufacturing process may be performed in a state where the hard mask pattern 110P remains on the plurality of conductive patterns 310P. The plurality of conductive patterns 310P may be formed to have a 1F width by interposing a distance with a 1F width therebetween. The plurality of conductive patterns 310P may constitute the plurality of conductive line patterns CL of the semiconductor device 200 shown in FIG. 2.

Figure 4:
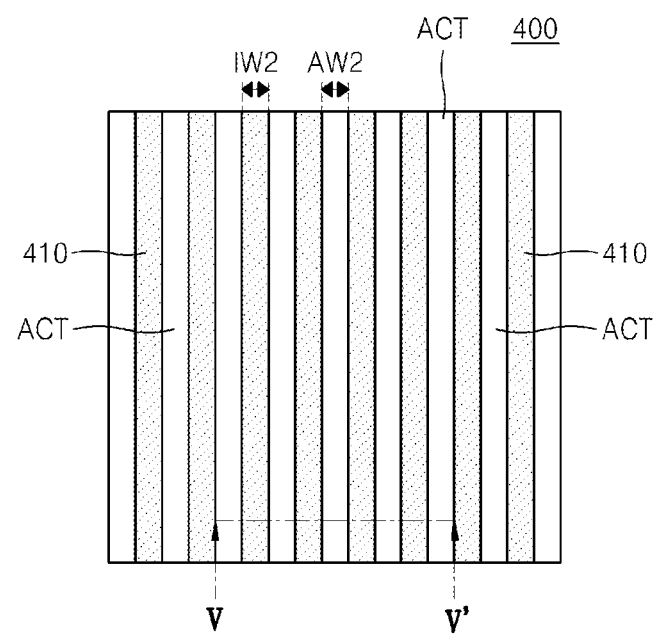
FIG. 4 is a diagram showing a layout of some components of a semiconductor device, according to example embodiments of the inventive concepts.

FIG. 4 is a diagram showing a layout of some components of a semiconductor device 400, according to example embodiments of the inventive concepts. FIG. 4 shows a layout of an active area ACT that is defined by a plurality of isolation films 410 in some areas of a cell array area in which a cell array of a semiconductor memory device is formed.

The plurality of isolation films 410 may have a shape of a plurality of line patterns that extend in a predetermined or given direction so as to be parallel to each other. The active area ACT having a linear shape may be defined by the plurality of isolation films 410. In example embodiments, a width IW2 of each of the plurality of isolation films 410 may be the same as a width AW2 of each active area ACT having a linear shape. However, example embodiments of the inventive concepts are not limited thereto, and the width AW2 of the active area ACT having a linear shape and the width IW2 of each of the plurality of isolation films 410 may be designed in various ways according to a desired arrangement design.

FIGS. 5A through 5G are cross-sectional views sequentially showing a method of forming a micro pattern of a semiconductor device, according to example embodiments of the inventive concepts.

In example embodiments described with reference to FIGS. 5A to 5G, a method will be described of defining the active area ACT of the semiconductor device 400 shown in FIG. 4 by using the method of forming a micro pattern according to example embodiments of the inventive concepts. FIGS. 5A to 5G show a cross-sectional configuration of a portion corresponding to a cross-section along line V-V' of FIG. 4. In FIGS. 5A to 5G, the same reference numerals as those in FIGS. 1A to 1J denote the same components, and the detailed description thereof will not be repeated for convenience of description.

Figure 5A:
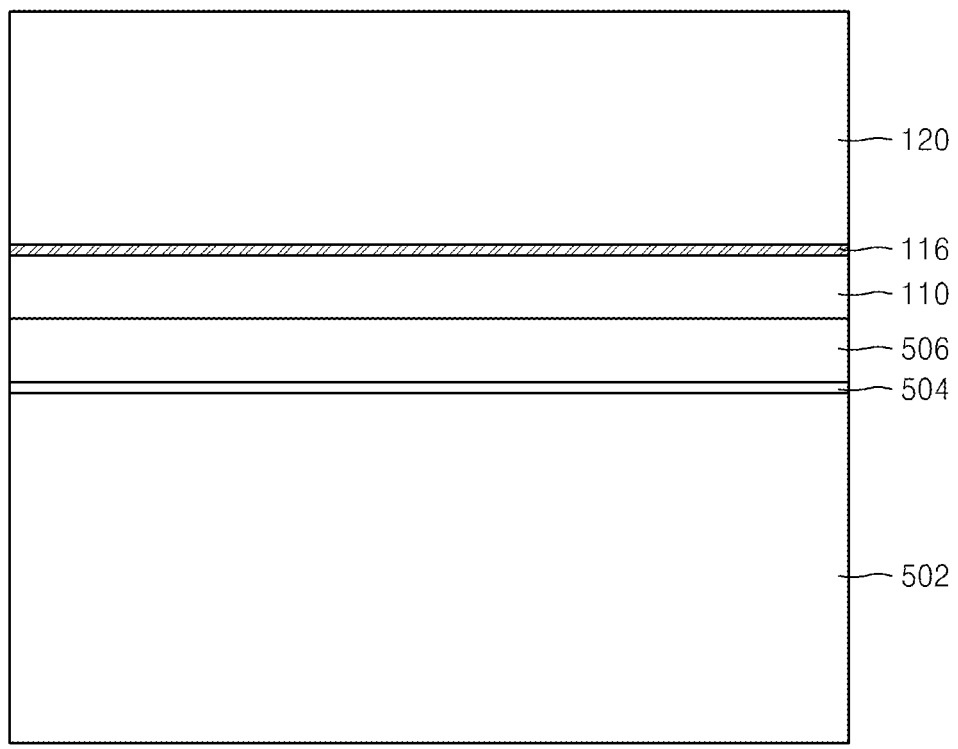
FIGS. 5A through 5G are cross-sectional views sequentially showing a method of forming a micro pattern of a semiconductor device, according to example embodiments of the inventive concepts.

Referring to FIG. 5A, a pad oxide film 504 and a nitride film 506 may be sequentially formed on a substrate 502. Thereafter, the hard mask layer 110, the acid-extinguisher containing film 116, and the photoresist film 120, which are described with reference to FIGS. 1A and 1B, may be sequentially formed on the nitride film 506. In example embodiments, the anti-reflective coating film 114 shown in FIG. 1A may be omitted. Details about the substrate 502 are the same as those about the substrate 102 described with reference to FIG. 1A.

Figure 5B:
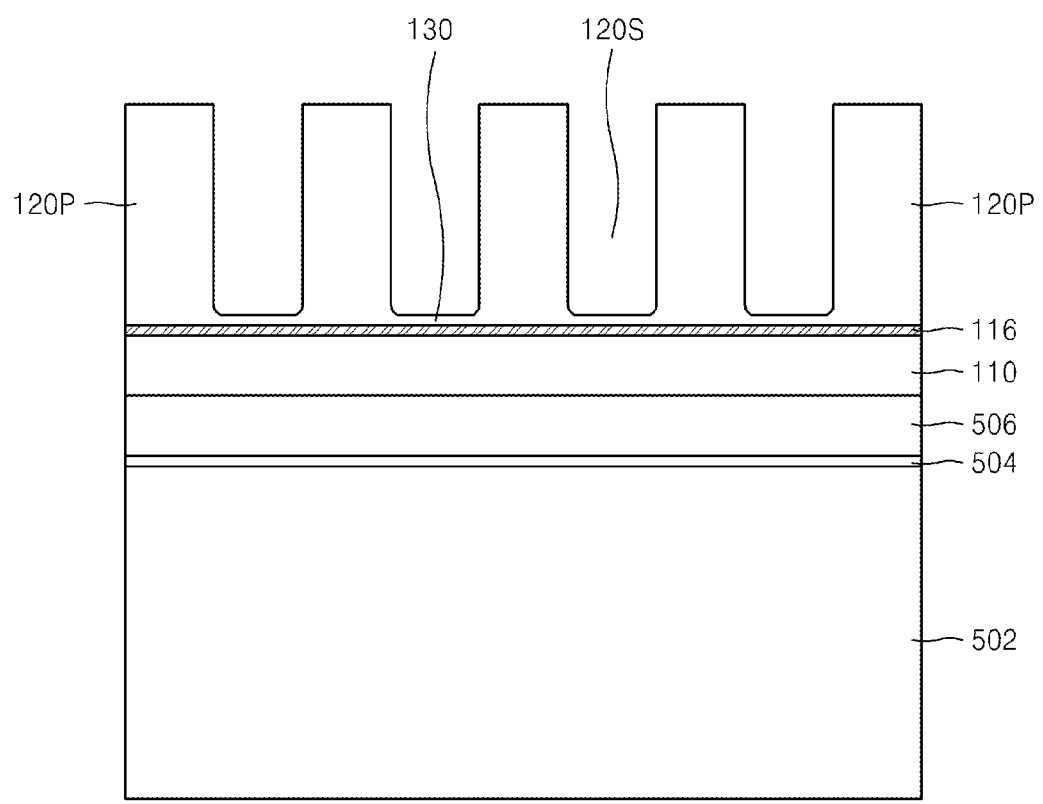

Referring to FIG. 5B, a part of the photoresist film 120 (see FIG. 5A) may be exposed using the method described with reference to FIGS. 1C to 1E, and the insoluble polymer thin film 130 may be formed between the acid-extinguisher containing film 116 and an exposed area of the exposed photoresist film and the exposed photoresist film is developed, thereby forming the space 120S exposing the insoluble polymer thin film 130 and the photoresist pattern 120P that is connected integrally to the insoluble polymer thin film 130.

A washing or rinsing and a dry process may be performed on the surface of the photoresist pattern 120P and the surface of the insoluble polymer thin film 130 that are obtained after the developing, by using the method described with reference to FIG. 1E.

Since the photoresist pattern 120P is connected integrally to the insoluble polymer thin film 130, a contact area between the insoluble polymer thin film 130 and the acid-extinguisher containing film 116 may perform an advantageous function in improving adhesion between the photoresist pattern 120P and the acid-extinguisher containing film 116. Thus, the photoresist pattern 120P may be prevented or inhibited from collapsing or tilting while the photoresist pattern 120P undergoes the developing process for forming the photoresist pattern 120P and the washing and dry processes that are performed after the developing process.

Figure 5C:
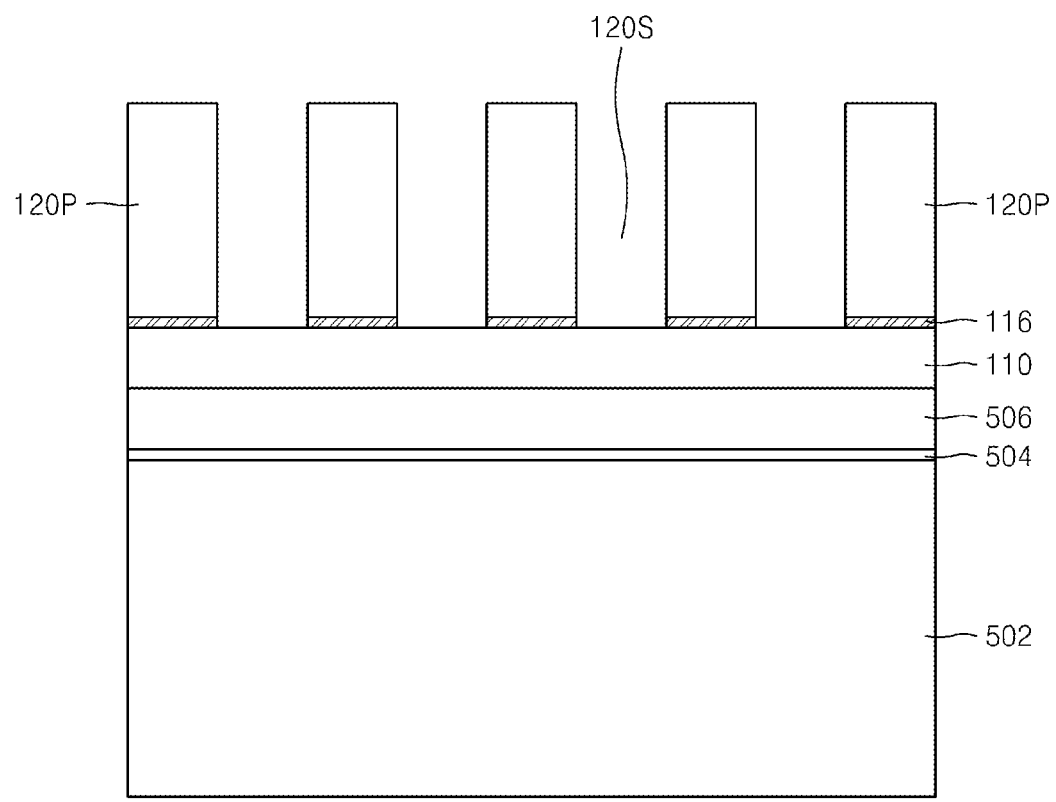

Referring to FIG. 5C, the insoluble polymer thin film 130 (see FIG. 5B) exposed through the space 120S is removed using the method described with reference to FIG. 1F so as to expose the acid-extinguisher containing film 116 through the space 120S. Thereafter, portions of the acid-extinguisher containing film 116, which are exposed through the space 120S, may be removed using a method similar to that described with reference to FIG. 1G so as to expose the hard mask layer 110 through the space 120S.

Figure 5D:
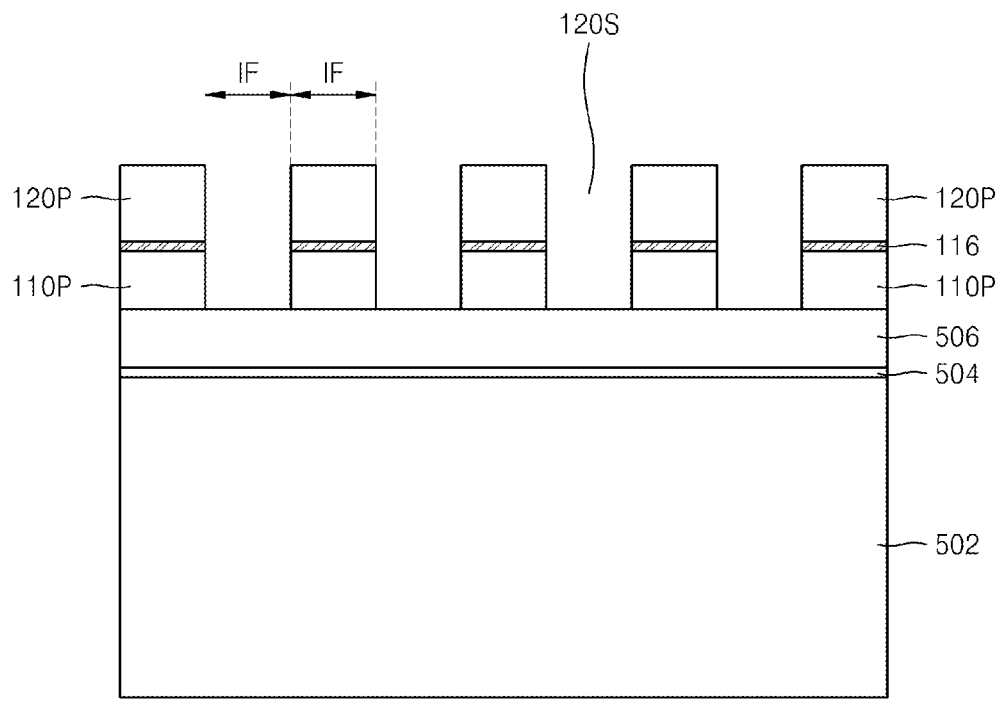

Referring to FIG. 5D, similarly to the method described with reference to FIG. 1I, anisotropic etching may be performed on the hard mask layer 110 exposed through the space 120S by using the photoresist pattern 120P as an etching mask so as to form the hard mask pattern 110P and to expose the nitride film 506 through the space 120S.

The photoresist pattern 120P may be consumed during the etching process of the hard mask layer 110 for forming the hard mask pattern 110P, and thus the photoresist pattern 120P may have a reduced thickness.

In example embodiments, the hard mask pattern 110P may be constituted by a plurality of lines and a plurality of space patterns that are formed to have a 1F width and are spaced apart from each other at intervals of 1F.

Figure 5E:
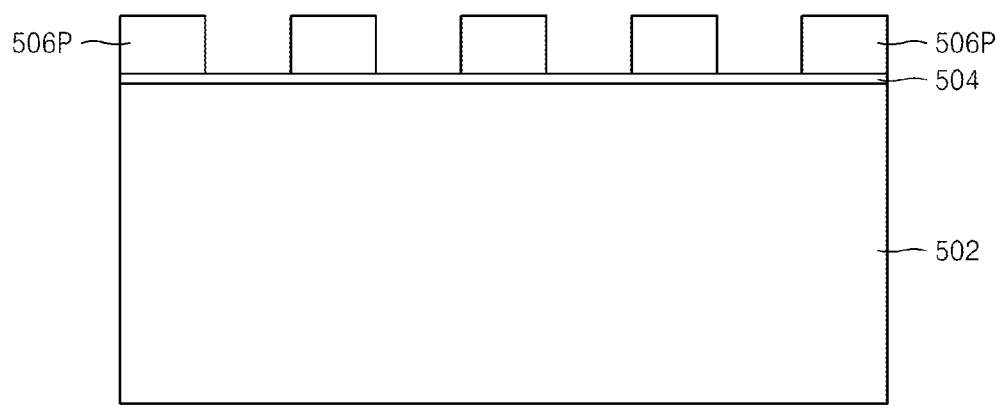

Referring to FIG. 5E, anisotropic etching may be performed on the nitride film 506 exposed through the space 120S by using the hard mask pattern 110P or the photoresist pattern 120P (see FIG. 5D) remaining on the hard mask pattern 110P as an etching mask, so as to form a nitride film pattern 506P.

Although not shown in FIG. 5E, after the nitride film pattern 506P is formed, residual layers of the hard mask pattern 110P may remain on the nitride film pattern 506P.

Figure 5F:
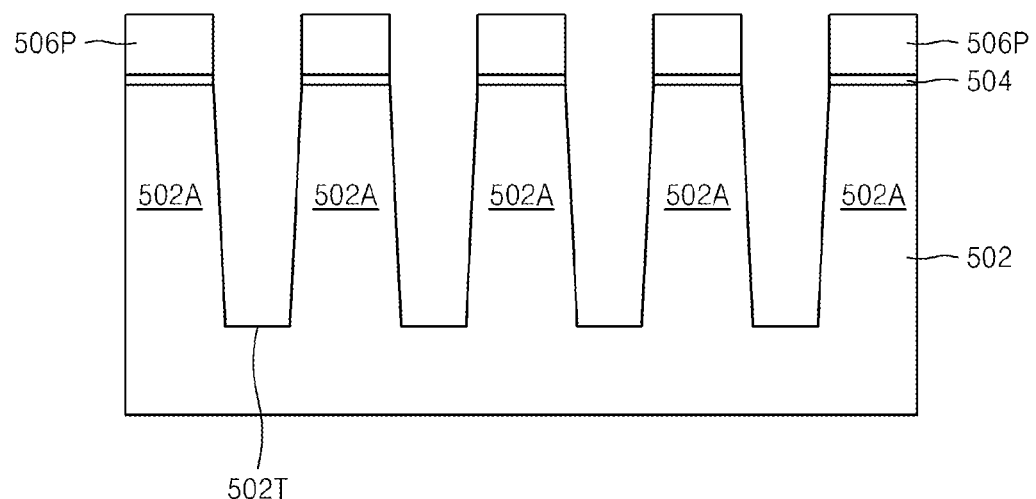

Referring to FIG. 5F, the pad oxide film 504 and the substrate 502 may be etched using the nitride film pattern 506P as an etching mask so as to form a plurality of trenches 502T in the substrate 502.

In example embodiments, the plurality of trenches 502T may be formed to have a 1F width by interposing a plurality of active areas 502A having a 1F width therebetween.

Figure 5G:
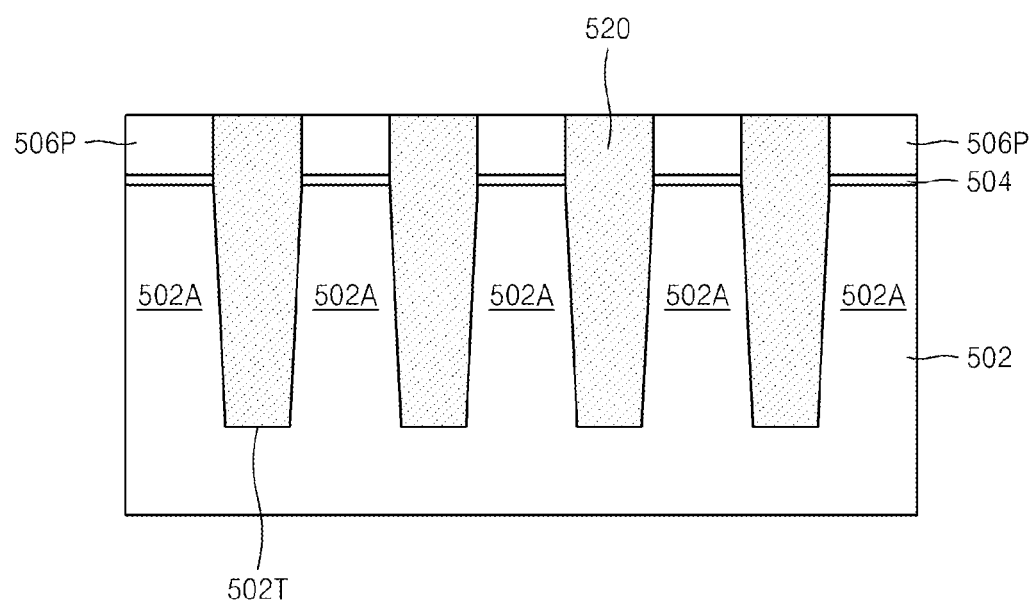

Referring to FIG. 5G, an insulating material may be deposited inside the plurality of trenches 502T and on the nitride film pattern 506P, and planarization may be performed using a chemical mechanical polishing (CMP) process until a top surface of the nitride film pattern 506P is exposed, thereby forming a plurality of isolation films 520 within the plurality of trenches 502T.

In example embodiments, the plurality of isolation films 520 may be formed to have a 1F width by interposing a linear active area 502A having a 1F width therebetween. The active area 502A may constitute the active area ACT of the semiconductor device 400 shown in FIG. 4.

Figure 6:
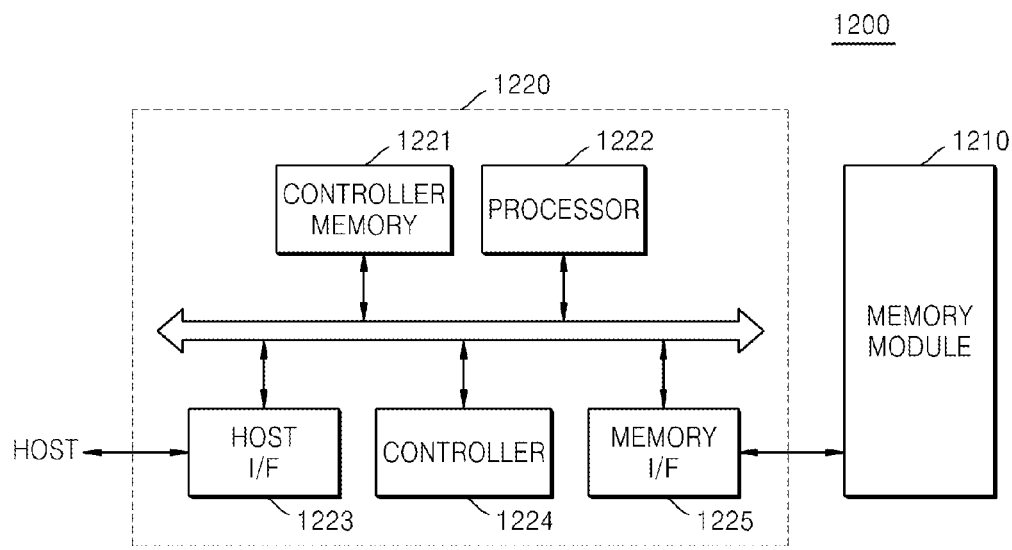
FIG. 6 is a block diagram of a memory card including a semiconductor device that is formed according to example embodiments of the inventive concepts.

FIG. 6 is a block diagram of a memory card 1200 including a semiconductor device that is formed according to example embodiments of the inventive concepts.

The memory card 1200 includes a memory controller 1220 that generates a command and address signal C/A, and a memory module 1210, for example, a flash memory including one or a plurality of flash memory devices. The memory controller 1220 includes a host interface 1223 that transmits a command and address signal to a host or receives a signal from the host, and a memory interface 1225 that transmits the command and address signal to the memory module 1210 or receives a signal from the memory module 1210. The host interface 1223, a controller 1224, and the memory interface 1225 communicate with a controller memory 1221, e.g., SRAM, and a processor 1222, e.g., a CPU, through a common bus.

The memory module 1210 receives the command and address signal from the memory controller 1220, stores data in at least one memory device on the memory module 1210, and searches data from the at least one memory device. Each memory device includes a plurality of addressable memory cells and a decoder that receives the command and address signal and generates a row signal and a column signal in order to access at least one of the plurality of addressable memory cells during programming and reading operations.

Components of the memory card 1200 including the memory controller 1220, electronic devices 1221, 1222, 1223, 1224, and 1225 included in the memory controller 1220, and the memory module 1210 may be formed to include a semiconductor device formed by the method of forming a micro pattern, according to example embodiments of the inventive concepts.

Figure 7:
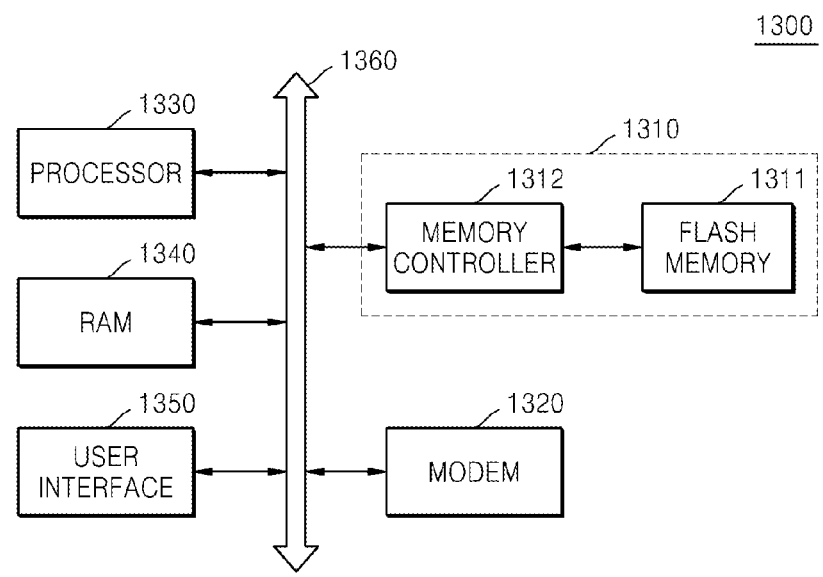
FIG. 7 is a block diagram of a memory system that employs the memory card including the semiconductor device that is formed according to example embodiments of the inventive concepts.

FIG. 7 is a block diagram of a memory system 1300 that employs a memory card 1310 including a semiconductor device that is formed according to example embodiments of the inventive concepts.

The memory system 1300 may include a processor 1330, e.g., a CPU, random access memory 1340, a user interface 1350, and a modem 1320 that communicate with each other through a common bus 1360. Each of these components transmits a signal to the memory card 1310 through the common bus 1360 and receives a signal from the memory card 1310. The memory card includes a memory controller 1312 and a flash memory 1311. Each of the components of the memory system 1300 including the memory card 1310, the processor 1330, the random access memory 1340, the user interface 1350, and the modem 1320 may be formed to include a micro pattern that is formed using the processes according to the example embodiments of the inventive concepts. The memory system 1300 may be used in various electronic application fields. For example, the memory system 1300 may be used in solid state drives (SSDs), CMOS image sensors (CISs), and computer application chip set fields.

The memory systems and the devices that are disclosed in the specification may be packaged in an arbitrary form from among various device package forms including, for example, ball grid arrays (BGA), chip scale packages (CSP), plastic leaded chip carriers (PLCC), plastic dual in-line packages (PDIP), multi-chip packages (MCP), wafer-level fabricated packages (WFP), and/or wafer-level processed stock packages (WSP), but example embodiments of the inventive concepts are not limited thereto.

In a method of forming a micro pattern of a semiconductor device, according to example embodiments of the inventive concepts, a contact area between an insoluble polymer thin film remaining in a space of a photoresist pattern and a lower film performs an advantageous function of improving adhesion between the photoresist pattern and the lower film. Thus, the photoresist pattern can be prevented or inhibited from collapsing or tilting during a developing process of the photoresist film or a washing or rinsing process and a dry process after the developing process. As such, the collapse or tilting of the photoresist pattern, which occurs when forming the micro pattern of the semiconductor device, may be controlled using the insoluble polymer thin film, thereby increasing the height of the photoresist pattern so as to increase an aspect ratio of the photoresist pattern. As a result, it is possible to improve an etching process margin when etching the lower films by using the photoresist pattern as an etching mask.

While the inventive concepts have been particularly shown and described with reference to example embodiments thereof, it will be understood that various changes in form and details may be made therein without departing from the spirit and scope of the following claims.

What is claimed is:

1. A method of forming a micro pattern of a semiconductor device, the method comprising:
    forming an acid-extinguisher containing film on a substrate;
    forming a photoresist film on the acid-extinguisher containing film, the photoresist film containing a potential acid;
    forming an exposed area by exposing a portion of the photoresist film to light, the exposed area containing acids;
    forming an insoluble polymer thin film between the acid-extinguisher containing film and the exposed area by extinguishing the acids of the exposed area at an interface between the acid-extinguisher containing film and the exposed area;
    developing the photoresist film to form a space exposing the insoluble polymer thin film in the exposed area and a photoresist pattern integrally connected to the insoluble polymer thin film;
    exposing the acid-extinguisher containing film through the space by removing the insoluble polymer thin film; and
    removing the acid-extinguisher containing film exposed through the space.

2. The method of claim 1, further comprising:
    washing a surface of the insoluble polymer thin film and a surface of the photoresist pattern before the exposing the acid-extinguisher containing film and after the developing the photoresist film.

3. The method of claim 2, further comprising:
    drying the washed insoluble polymer thin film and the washed photoresist pattern before the exposing the acid-extinguisher containing film and after the washing a surface of the insoluble polymer thin film and a surface of the photoresist pattern.

4. The method of claim 1, wherein the forming a photoresist film forms the photoresist film containing the potential acid including one of a photoacid generator (PAG), a thermoacid generator (TAG), and a mixture thereof.

5. The method of claim 1, wherein the forming an acid-extinguisher containing film includes forming the acid-extinguisher containing film including a basic material.

6. The method of claim 1, wherein the forming an acid-extinguisher containing film includes forming the acid-extinguisher containing film including a basic material having a boiling point higher than 120° C.

7. The method of claim 1, wherein the forming an acid-extinguisher containing film includes applying a mixed solution of a basic material and a solvent onto the substrate.

8. The method of claim 7, wherein the applying a mixed solution includes applying the mixed solution further containing a matrix polymer.

9. The method of claim 1, wherein the forming an acid-extinguisher containing film includes supplying a gas-phase basic material onto the substrate.

10. The method of claim 1, wherein the forming an acid-extinguisher containing film includes forming a basic material layer using one of an atomic layer deposition (ALD) process, a chemical vapor deposition (CVD) process, and a physical vapor deposition (PVD) process.

11. The method of claim 1, wherein:
    the forming an acid-extinguisher containing film includes forming the acid-extinguisher containing film including a basic material, and
    the forming an insoluble polymer thin film includes extinguishing the acids of the exposed area by diffusing the basic material from the acid-extinguisher containing film to the exposed area.

12. A method of forming a micro pattern of a semiconductor device, the method comprising:
    forming an acid-extinguisher containing film on a substrate including a portion to be etched;
    forming a photoresist film on the acid-extinguisher containing film;
    exposing a portion of the photoresist film to light;
    forming an insoluble polymer thin film in the exposed portion of the photoresist film, the insoluble polymer thin film being in contact with the acid-extinguisher containing film;
    forming a photoresist pattern integrally connected to the insoluble polymer thin film by developing the photoresist film;
    exposing the acid-extinguisher containing film by etching the insoluble polymer thin film using the photoresist pattern as an etching mask;
    exposing the portion of the substrate to be etched by etching the acid-extinguisher containing film using the photoresist pattern as an etching mask; and
    etching the portion of the substrate to be etched using the photoresist pattern as an etching mask.

13. The method of claim 12, wherein the exposing the acid-extinguisher containing film includes removing the insoluble polymer thin film using a dry etching process.

14. The method of claim 12, wherein:
    the exposing a portion of the photoresist film includes generating acids within the exposed portion of the photoresist film, and
    the forming an insoluble polymer thin film includes extinguishing the acids within the exposed portion by diffusing an acid-extinguisher from the acid-extinguisher containing film to the exposed portion of the photoresist film.

15. The method of claim 12, wherein the forming an acid-extinguisher containing film includes forming the acid-extinguisher containing film including a basic material, further comprising:
    heating the photoresist film at a temperature lower than a boiling point of the basic material in the acid-extinguisher containing film before the exposing a portion of the photoresist film to light and after forming the photoresist film.

16. A method comprising:
    forming a photoresist film on a lower film;
    exposing a portion of the photoresist film to light;

forming an upper film in the exposed portion of the photoresist film such that the upper film is in contact with the lower film, the upper film being insoluble in an alkaline aqueous solution;

forming a photoresist pattern integrally connected to the upper film by developing the photoresist film; and exposing the lower film by removing the upper film using the photoresist pattern as an etching mask.

17. The method of claim 16, wherein the exposing the lower film includes removing the upper film using a dry etching process.

18. The method of claim 16, wherein:

the exposing a portion of the photoresist film includes generating acids within the exposed portion of the photoresist film, and the forming an upper film includes extinguishing the acids within the exposed portion by diffusing an acid-extinguisher from the upper film to the exposed portion of the photoresist film.

19. The method of claim 16, further comprising:

washing a surface of the upper film and a surface of the photoresist pattern before the exposing the lower film and after the forming a photoresist pattern.

20. The method of claim 19, further comprising:

drying the washed upper film and the washed photoresist pattern before the exposing the lower film and after the washing a surface of the upper thin film and a surface of the photoresist pattern.

* * * * *